(12) United States Patent
Deval et al.

(10) Patent No.: US 8,462,473 B2
(45) Date of Patent: Jun. 11, 2013

(54) ADAPTIVE ELECTROSTATIC DISCHARGE (ESD) PROTECTION CIRCUIT

(75) Inventors: Philippe Deval, Lutry (CH); Nicolas Furrer, Boudry (CH); Bart De Geeter, Lausanne (CH)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/288,080

(22) Filed: Nov. 3, 2011

(65) Prior Publication Data

US 2012/0154963 A1 Jun. 21, 2012

Related U.S. Application Data

(60) Provisional application No. 61/425,552, filed on Dec. 21, 2010.

(51) Int. Cl.
*H02H 9/00* (2006.01)
*H01C 7/12* (2006.01)
*H02H 1/00* (2006.01)
*H02H 1/04* (2006.01)
*H02H 3/22* (2006.01)

(52) U.S. Cl.
USPC ............................................. 361/56; 361/118

(58) Field of Classification Search
USPC .................................................. 361/56, 118
See application file for complete search history.

(56) References Cited

U.S. PATENT DOCUMENTS

| | | | | |
|---|---|---|---|---|
| 7,102,862 B1 * | 9/2006 | Lien et al. | ........................ | 361/56 |
| 7,397,642 B2 * | 7/2008 | Ker et al. | ........................ | 361/56 |
| 7,495,878 B2 * | 2/2009 | Todd | ............................. | 361/111 |
| 8,345,396 B2 * | 1/2013 | Wang et al. | ....................... | 361/58 |
| 2003/0090845 A1 * | 5/2003 | Ker et al. | ........................ | 361/56 |
| 2003/0201457 A1 | 10/2003 | Lin et al. | ........................ | 257/173 |
| 2009/0128969 A1 | 5/2009 | Deval et al. | ........................ | 361/56 |

OTHER PUBLICATIONS

Mergens, et al., "ESD Protection Considerations in Advanced High-Voltage Technologies for Automotive", EOS/ESD Symposium 06-54, pp. 54-63, Sep. 10, 2006.

Yen, et al., "The Effect of IEC-Like Fast Transients on RC-Triggered ESD Power Clamps", IEEE Transactions on Electron Devices, vol. 56, No. 6, Jun. 1, 2009.

International PCT Search Report and Written Opinion, PCT/US2011/064180, 12 pages, Apr. 12, 2012.

\* cited by examiner

*Primary Examiner* — Dharti Patel
(74) *Attorney, Agent, or Firm* — King & Spalding L.L.P.

(57) ABSTRACT

For adaptive electrostatic discharge (ESD) protection, an integrated circuit device having an adaptive electrostatic discharge (ESD) protection, has an external connection pin to be protected from ESD; an external ground connection pin; an adaptive electrostatic discharge (ESD) protection circuit having: an ESD protection N-metal oxide semiconductor (NMOS) transistor having drain connected to the external connection pin and a source and bulk connected to ground; a resistor coupled between a gate of the NMOS transistor and ground; a first PMOS transistor having a source coupled to a gate of the NMOS transistor and a drain connected to ground; a first capacitor having a first terminal connected to the external connection pin and a second terminal that is coupled with the gate of the NMOS transistor, wherein the first capacitor within the adaptive ESD protection circuit is the only capacitor connected to the external connection pin.

38 Claims, 17 Drawing Sheets

ADAPTIVE ELECTROSTATIC DISCHARGE (ESD) PROTECTION CIRCUIT

CROSS-REFERENCE TO RELATED APPLICATIONS

This application claims the benefit of U.S. Provisional Application No. 61/425,552 filed on Dec. 21, 2010, entitled "ADAPTIVE ELECTROSTATIC DISCHARGE (ESD) PROTECTION CIRCUIT", which is incorporated herein in its entirety.

TECHNICAL FIELD

The present disclosure relates to an adaptive electrostatic discharge protection circuit within integrated circuit devices that are capable of, for example, interfacing to a Local Interconnect Network (LIN) bus and the like, e.g., as used in automotive electronics, and more particularly, to achieving high electrostatic discharge (ESD) robustness when handled, plugged into or removed from the LIN bus and the like, and having high electro magnetic interference (EMI) immunity when operating on the LIN bus and the like.

BACKGROUND

The ever-increasing importance of electronics in automobiles brings with it a growing challenge and need for low-cost, reliable electronic systems and subsystems that require input-output devices that interface with sensors and actuators. These systems and subsystems are not isolated, and must communicate with each other.

Historically, automotive electronics have been built up using discrete, smaller integrated circuits. They relied on proprietary, dedicated wire communication schemes, at least for many sensor systems, and directly wired power outputs to the actuators. This led to large printed-circuit boards (PCBs), large engine-control unit (ECU) housing sizes, and excessive wiring bundles. Wiring brings with it other problems since it consumes space, adds weight and expense, is subject to the vehicle's electromagnetic noise, and can be difficult to trouble shoot and maintain.

Fortunately, advances in vehicle-networking standards and mixed-signal semiconductor processes are addressing these issues and introducing new possibilities to distribute intelligent systems throughout a vehicle. The trend in vehicle-networking standardization includes the wide adoption of Controller Area Network (CAN) and the Local Interconnect Network (LIN) architecture, now in version 2.1.

These network standards are providing a balance between performance and cost optimization across automotive systems. CAN provides a high-speed network for chassis, power-train and body-backbone communications, while LIN answers the need for a simple network for sensor and actuator subsystems that reduces cost and improves robustness through standardization. The wide use of CAN and the availability of LIN coincides with advances in mixed-signal semiconductor-process technologies that can bring together all the functionality needed for smaller automotive systems onto a single integrated circuit (IC), or a few ICs for more advanced systems.

While LIN was originally targeted for the vehicle's body electronics, it is proving its value in new ways with many implementations outside of body electronics. Among the automotive-electronic bus standards available, LIN provides the best solution for the communication needs of most sensors and actuators which are normally dedicated to a single system. They can be viewed as subsystems and are well served by LIN, which has been defined to fill a sub-network role in the vehicle. The maximum LIN specified data rate of twenty kilobits per second (kbps) is sufficient for most sensors and actuators. LIN is a time-triggered, master-slave network, eliminating the need for arbitration among simultaneously reporting devices. It is implemented using a single wire communications bus, which reduces wiring and harness requirements and thus helps save weight, space and cost.

Defined specifically for low-cost implementation of vehicle sub-network applications by the LIN Consortium, the LIN standard aligns well to the integration capabilities of today's mixed-signal semiconductor processes. The LIN protocol achieves significant cost reduction since it is fairly simple and operates via an asynchronous serial interface (UART/SCI), and the slave nodes are self-synchronizing and can use an on-chip RC oscillator instead of crystals or ceramic resonators. As a result, silicon implementation is inexpensive, making LIN very suitable for the mixed-signal process technologies typically used to manufacture signal-conditioning and output ICs for automotive subsystems.

The LIN master node is normally a bridge node of the LIN sub-network to a CAN network, and each vehicle will typically have several LIN sub-networks. The master LIN node has higher complexity and control, while the slave LIN nodes are typically simpler, enabling their integration in single IC subsystems. Through the use of standardized vehicle-networking architectures, it is possible to build a feature- and diagnostic-rich system that requires only three wires (LIN, battery and ground)

For obvious reasons of reliability and safe operation a very high immunity for both ESD (Electro Static Discharge) and EMI (Electro Magnetic Interference) is required for all the LIN modules. This high ESD and EMI immunity specially applies to the pins of a LIN module that are connected to the external world (e.g., battery pin, LIN pin, etc.)

The pins of a LIN module that are connected to the system (external world) are highly exposed to ESD discharge when the module is handled or plugged into the system. A LIN module must be able to be safely installed or removed by any one. Therefore the ESD immunity needs to be very high (greater than several kilovolts) for all of the LIN module pins since the standard industry rules for handling an electrical module cannot be properly enforced in the automotive industry.

In addition once installed, any pin connected to the LIN system may see a high level of interferences coming from the other communications busses and/or power supply lines. The reason is that the communications busses and power supply lines cannot be wired with efficient shielding or differential signal lines (except for CAN) for cost reasons. Therefore the high interference levels present in automobile electrical and control systems must not impact the integrity of the desired data transiting on the LIN bus.

Thus very high immunity to both ESD and EMI is required for any pin of a chip that is directly routed to the connector of a LIN module. A commonly used device for ESD protection is a grounded gate metal oxide semiconductor (GGMOS) transistor that has its gate grounded through an ESD protection resistor. A common technique to enhance the ESD robustness of the GGMOS transistor used for ESD protection of a respective external connection (pin) is to have some capacitive coupling between the drain and the gate of the GGMOS transistor protection device.

Unfortunately this ESD protection technique dramatically increases the sensitivity of the pin to noise interferences or EMI: The capacitive coupling between the drain and the gate allows high frequencies to reach the gate of the protection device and turn it on. This corrupts the desired data flow. Therefore the capacitive coupling significantly degrades a high EMI robustness. Therefore, standard ESD protection techniques are not well suited to achieve a high noise and interference immunity for EMI and the like.

Referring to FIGS. 1 and 2, depicted are a schematic block diagram and a more detailed circuit diagram of conventional ESD and EMI optimization circuits. The integrated circuit 100 comprises, for example, a circuit function 106 coupled through a driver 104a which may be an open drain transistor, a tri-state driver, etc. and through a receiver 104b which may be a level detector with external pins 118 and 222. The receiver 104b and/or driver 104a is/are also coupled to the signal ground 220 which is connected to the external ground or common connection 222 that may be located on an integrated circuit package of the integrated circuit device 100. The integrated circuit device 100 may be used for example but is not limited to LIN module implementation.

The I/O connection 118 is protected by the ESD protection circuit 108 that comprises a metal oxide semiconductor (MOS) device 224 in a grounded gate configuration and is used as an ESD protection device. The ESD protection MOS device 224 source is coupled to the ESD ground or common 120, the drain is coupled to the I/O connection 118 to be protected, and the gate is returned to the ESD ground or common 120 through a gate resistor 226. The ESD ground or common 120 may be further coupled to the external ground or common connection, e.g., connection 222.

The ESD enhancement capacitor 112 when coupled between the source and gate of the ESD protection MOS device 224 will improve ESD protection and reduce the snap back voltage of the MOS device 224. The MOS device 228 will normally be off when substantially no voltage is present on its gate, thereby allowing the ESD enhancement capacitor 112 to be coupled between the source and gate of the MOS device 224, whereby the ESD robustness is maximal. This occurs when no high frequency EMI signal/perturbation is present, e.g., when the LIN part is out of the system or there is substantially no EMI signal/perturbation present. The Data signal is much lower in frequency than the EMI signal/perturbation (noise) and is thereby blocked by the HPF 116, so only when the high frequency EMI noise is present will the MOS device 228 be turned on.

A low value resistance 230 may also be coupled in series with the ESD enhancement capacitor 112. When a voltage is applied to the gate of the switching MOS device 228, the ESD enhancement capacitor 112 is effectively bypassed to the ESD ground or common 120, thereby removing any influence that it may have on the MOS device 224. The low value resistance 230 improves the efficiency of the switching (bypassing) MOS device 228.

ESD capacitor control 110 decouples the ESD enhancement capacitor 112 from the gate and/or drain of the MOS device 224. The ESD capacitor control 110 may also be an ESD capacitor attenuator by operating the MOS device 228 in its linear range and not as a switch. The attenuation becomes a function of the resistance value of the resistor 230 and the equivalent resistance of the MOS device 228. Thus the MOS device 228 may be used to adjust the drain-to-gain coupling of the ESD enhancement capacitor 112 so that proportional ESD protection may be provided according to the strength of the EMI signal on the I/O connection 118. So that the attenuation adapts to the EMI level and the drain-to-gate capacitive coupling is always maintained to a level that prevents the ESD protection MOS device 224 from being undesirably turned on.

The voltage applied to the gate of the switching device 228 is supplied by the signal amplitude detector 114. The signal amplitude detector 114 may comprise a signal rectifying diode 238, a low pass filter resistor 234 and a low pass filter capacitor 232. The high-pass filter 116 may comprise a coupling/high-pass filter capacitor 126 and a load/high-pass filter resistor 236. The high-pass filter 116 lets the perturbation (high frequency) signal reach the input of the signal amplitude detector 114, but blocks the data (low frequency) signal. The order of the high-pass filter 116 depends on the difference between the lowest EMI frequency that needs to reach the input of the signal amplitude detector 114 and the maximum data frequency. According to the teachings of this disclosure, the minimum EMI frequency needing to be detected by the signal amplitude detector 114 may be 1 MHz (HF) while a maximum data rate of 20 Kbaud induces, for example, a maximum data frequency of 10 KHz (LF). Therefore a first order high-pass filter 116 is sufficient to let the EMI perturbation reach the input of the signal amplitude detector 114 while blocking the data signal. So only a EMI perturbation signal, with or without a data signal present, will pass to the signal amplitude detector 114 from the HPF 116. If there is substantially no EMI perturbation signal (HF) present, even if a strong data signal (LF) is present, the signal amplitude detector 114 will not activate the ESD capacitor control 110. Thus the capacitor 112 remains in the ESD circuit during reception of the data signal when there is substantially no EMI perturbation noise present. However, if a strong EMI signal is superimposed on a data transmission/reception, the EMI signal will be detected and the capacitor 112 will be decoupled to prevent or substantially reduce possible data corruption.

When a perturbation signal, e.g., a pulse train of on and off voltages, on the I/O connection 118 is coupled through the high-pass filter 116 to the signal amplitude detector 114, the diode 238 rectifies the received signal to produce a pulsating direct current (DC) voltage that is smoothed and filtered in the low pass filter comprising the resistor 234 and capacitor 232. The low pass filter introduces a delay from first detection of the received signal to generating the control voltage for the gate of the switching MOS device 228. This delay is of no consequence since the delay is much shorter than the pulse duration width of data signals normally processed by the circuit function 106 and either transmitted or received at the I/O connection 118.

Bipolar transistor 240 further improves operation of the ESD capacitor control 110 by reducing the equivalent switch resistance. The bipolar device 240 reduces, by a factor of Beta (Beta is the current gain of the bipolar device 240), the resistance of the switching device. Thereby achieving a low switching resistance in a small die area. Moreover the non-linear characteristic of the bipolar device 240 induces a rectifying effect that adds a negative DC component on the voltage applied to the gate of the ESD protection device 224. This negative DC component on the voltage applied to the gate of the ESD protection device 224 helps to put it into cutoff. However, introducing the bipolar device 240 adds a $V_{be}$ (0.7 volt) bias voltage in series with the equivalent resistance of the switch. Therefore this technique can only be applied with an ESD MOS device 224 having a threshold voltage higher than the $V_{be}$ voltage of the bipolar device 240. The lower limit for the threshold voltage of the MOS device 224 is in the range of 1 volt. However, for such a threshold voltage, devices 228 and 240 need to be very strong and thus very wide. Thus a threshold in the range of 1.5V or more will be preferred for the MOS device 224.

The delay introduced by the low pass filter (resistor 234 and capacitor 232) of the signal amplitude detector 114 allows good protection in case of an ESD event. An ESD event is a transient that contains many high frequencies. Therefore a voltage is built up at the output of the signal amplitude detector 114 after an ESD event. Without the signal amplitude detector 114 delay, this voltage would build up instantaneously and the capacitive coupling through the ESD enhancement capacitor 112 would thereby be substantially bypassed. But the ramping time in the case of an ESD event is in the nanosecond (ns) range while the delay of the low-pass filter is in the range of hundreds of nanoseconds. Therefore the ramping edge of an ESD event is coupled unaffected to the gate of the ESD protective MOS device 224. So the triggering threshold of the ESD protective MOS device 224 remains unchanged. This means that the ESD protection reacts exactly the same way as the basic capacitive coupling technique discussed more fully hereinabove. Or in the case of varying the influence of the ESD enhancement capacitor 112 on the ESD protection MOS device 224 in proportion to a signal detected by the amplitude detector 114 will thereby always maintain a level that prevents the ESD protection MOS device 224 from being undesirably turned on.

This conventional protection circuit requires two separate AC couplings through capacitors 112 and 126. Furthermore, a medium or high voltage threshold (>1.5V) ESD device is needed for the ESD transistor as explained above as well as a very fast PNP transistor 240. Certain processes in semiconductor manufacturing may not allow to create such devices.

SUMMARY

Hence, a need exists for an improved ESD protection of a device that can be created by various semiconductor manufacturing processes.

According to an embodiment, an integrated circuit device having an adaptive electrostatic discharge (ESD) protection, may comprise an external connection pin to be protected from ESD; an external ground connection pin; an adaptive electrostatic discharge (ESD) protection circuit comprising: an ESD protection N-metal oxide semiconductor (NMOS) transistor having drain connected to the external connection pin and a source and bulk connected to ground; a resistor coupled between a gate of the NMOS transistor and ground; a first PMOS transistor having a source coupled to a gate of the NMOS transistor and a drain connected to ground; and a first capacitor having a first terminal connected to the external connection pin and a second terminal that is coupled with the gate of the NMOS transistor, wherein the first capacitor within the adaptive ESD protection circuit is the only capacitor connected to the external connection pin.

According to a further embodiment, the integrated circuit device may further comprise a second P-metal oxide semiconductor (PMOS) transistor having a drain connected to the second terminal of the first capacitor, a source and bulk connected to the gate of the NMOS transistor and a gate connected to ground, wherein a source and bulk of the first PMOS transistor is connected to the gate of the NMOS transistor and a drain of the first PMOS transistor is connected to ground; and a filter coupled between the second terminal of the first capacitor and the gate of the first PMOS transistor. According to a further embodiment, the filter may comprise a second resistor connected between the second terminal of the first capacitor and a gate of the first PMOS transistor and a second capacitor connected between the source and the gate of the first PMOS transistor. According to a further embodiment, the time constant of the filter can be about 400 ns. According to a further embodiment, the time constant of the filter can be about 400 ns. According to a further embodiment, the integrated circuit device may further comprise a data bus interface coupled to the external connection; a circuit function coupled to the data bus interface. According to a further embodiment, the data bus interface can be at least one of a data bus receiver and a data bus driver. According to a further embodiment, the circuit function can be a digital logic function. According to a further embodiment, the circuit function can be an analog circuit function or a mixed signal circuit function.

According to a further embodiment, the integrated circuit device may further comprise a third resistor coupled in parallel with said second capacitor. According to a further embodiment, the integrated circuit device may further comprise a third PMOS transistor having a drain and gate connected to the gate of the second PMOS transistor, a bulk connected to the bulk of the first PMOS transistor, and a source connected to ground. According to a further embodiment, the integrated circuit device may further comprise a third PMOS transistor having a drain and gate connected to the gate of the second PMOS transistor, a bulk and source connected to the bulk and source of the second PMOS transistor.

According to a further embodiment, a data bus to be connected to the external connection can be a Local Interconnect Network (LIN) bus or a Controller Area Network (CAN) bus. According to a further embodiment, the integrated circuit device may further comprise a second P-metal oxide semiconductor (PMOS) transistor having a drain connected to the second terminal of the first capacitor, a source and bulk connected to ground, wherein the source and a bulk of the first PMOS transistor are connected to the gate of the NMOS transistor and a drain of the first PMOS transistor is connected to ground; and a filter coupled between the second terminal of the first capacitor and the first PMOS transistor. According to a further embodiment, the gate of the second PMOS transistor can be coupled with ground. According to a further embodiment, the integrated circuit device may further comprise a second capacitor coupled between the gate of the NMOS transistor and ground. According to a further embodiment, the gate of the second PMOS transistor can be coupled with the gate of the NMOS transistor. According to a further embodiment, the filter may comprise a second resistor connected between the second terminal of the first capacitor and a gate of the first PMOS transistor and a second capacitor connected between the source and the gate of the first PMOS transistor. According to a further embodiment, the integrated circuit device may further comprise a third resistor coupled in parallel with said second capacitor. According to a further embodiment, the integrated circuit device may further comprise a third PMOS transistor having a drain and gate connected to the gate of the first PMOS transistor, a bulk connected to the bulk of the second PMOS transistor, and a source connected to ground. According to a further embodiment, the integrated circuit device may further comprise a third PMOS transistor having a drain and gate connected to the gate of the first PMOS transistor, a bulk and source connected to the bulk and source of the first PMOS transistor. According to a further embodiment, the time constant of the filter can be about 400 ns.

According to a further embodiment, the integrated circuit device may further comprise a second P-metal oxide semiconductor (PMOS) transistor having a drain connected to the second terminal of the first capacitor, a bulk connected to the gate of the NMOS transistor, and a source and gate connected to ground, wherein the source and a bulk of the first PMOS transistor are connected to the gate of the NMOS transistor and the drain of the first PMOS transistor is connected to ground; a second resistor connected between the second terminal of the first capacitor and a gate of the first PMOS transistor and a second capacitor connected between the source and the gate of the first PMOS transistor, and a third PMOS transistor having a source and gate connected to the gate of the first PMOS transistor, a drain connected to the ground and a bulk connected to the bulk of the second PMOS transistor.

According to a further embodiment, the integrated circuit device may further comprise a second P-metal oxide semiconductor (PMOS) transistor having a drain coupled to the second terminal of the first capacitor, a bulk and source connected to a bulk of the first PMOS transistor, and a gate connected to ground, wherein a gate of the first PMOS transistor is connected to ground. According to a further embodiment, the integrated circuit device may further comprise a second resistor connected between the gate of the NMOS transistor and the drain of the second PMOS transistor. According to a further embodiment, a gate-drain capacitance of the NMOS transistor may form the first capacitor. According to a further embodiment, the integrated circuit device may further comprise a second capacitor connected between the gate of the NMOS transistor and ground. According to a further embodiment, the integrated circuit device may further comprise a second resistor connected between the gate of the NMOS transistor and the first resistor.

According to a further embodiment, the resistor may be formed by a transistor. According to a further embodiment, the second resistor may be formed by a transistor. According to a further embodiment, a gate-drain capacitance of the NMOS transistor may form the first capacitor. According to a further embodiment, a bulk and a gate of the first PMOS transistor can be connected to ground. According to a further embodiment, the source of the first PMOS transistor can be connected with the gate of the NMOS transistor through a second resistor.

According to a further embodiment, a bulk and a gate of the first PMOS transistor can be connected to ground. According to a further embodiment, the source of the first PMOS transistor can be connected with the gate of the NMOS transistor through a second resistor. According to a further embodiment, the integrated circuit device may further comprise a third resistor connected between the second terminal of the first capacitor and the source of the first PMOS transistor.

According to yet another embodiment, a motor vehicle may comprise a data bus selected from the group consisting of a Local Interconnect Network (LIN) bus and a Controller Area Network (CAN) bus; an integrated circuit device having an adaptive electrostatic discharge (ESD) protection, the integrated circuit device comprising: a data bus interface coupled via an external connection pin with said data bus; a circuit function coupled to the data bus interface; an external ground connection pin; an ESD protection N-metal oxide semiconductor (NMOS) transistor having drain connected to the external connection pin and a source and bulk connected to ground; a resistor coupled between a gate of the NMOS transistor and ground; a first capacitor having a first terminal connected to the external connection pin; a first P-metal oxide semiconductor (PMOS) transistor having a drain connected to the second terminal, a source and bulk connected to the gate of the NMOS transistor and a gate connected to ground; a second PMOS transistor having a source and bulk connected to the gate of the NMOS transistor and a drain connected to ground; and a filter comprising a second resistor connected between the second terminal of the first capacitor and a gate of the second PMOS transistor and a second capacitor connected between the source and the gate of the second PMOS transistor.

BRIEF DESCRIPTION OF THE DRAWINGS

A more complete understanding of the present disclosure may be acquired by referring to the following description taken in conjunction with the accompanying drawings wherein.

Figure 1:
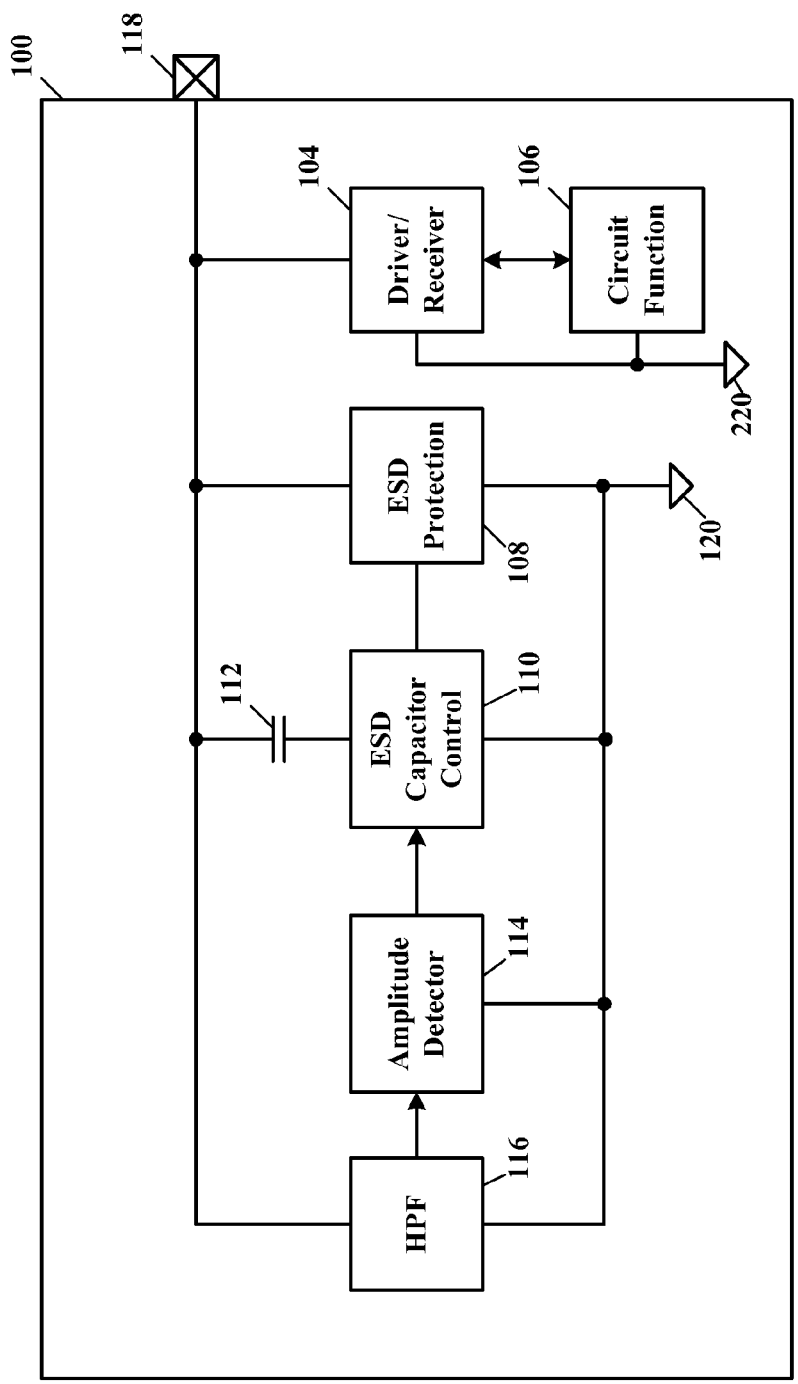
FIG. 1 is a schematic block diagram of a conventional implementation of an ESD and EMI optimization circuit.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

As mentioned above, the protection circuit according to various embodiments can be used to protect a Local Interconnect Network (LIN) bus connection pin and the like, e.g., as used in automotive electronics, and more particularly, to achieving high electrostatic discharge (ESD) robustness when handled, plugged into or removed from the LIN bus and the like, and having high electro magnetic interference (EMI) immunity when operating on the LIN bus and the like. Thus, the following described techniques and associated circuit diagrams are designed for the LIN pin. However the various embodiments and associated techniques may be applied to any pin of an integrated circuit device.

Figure 2:
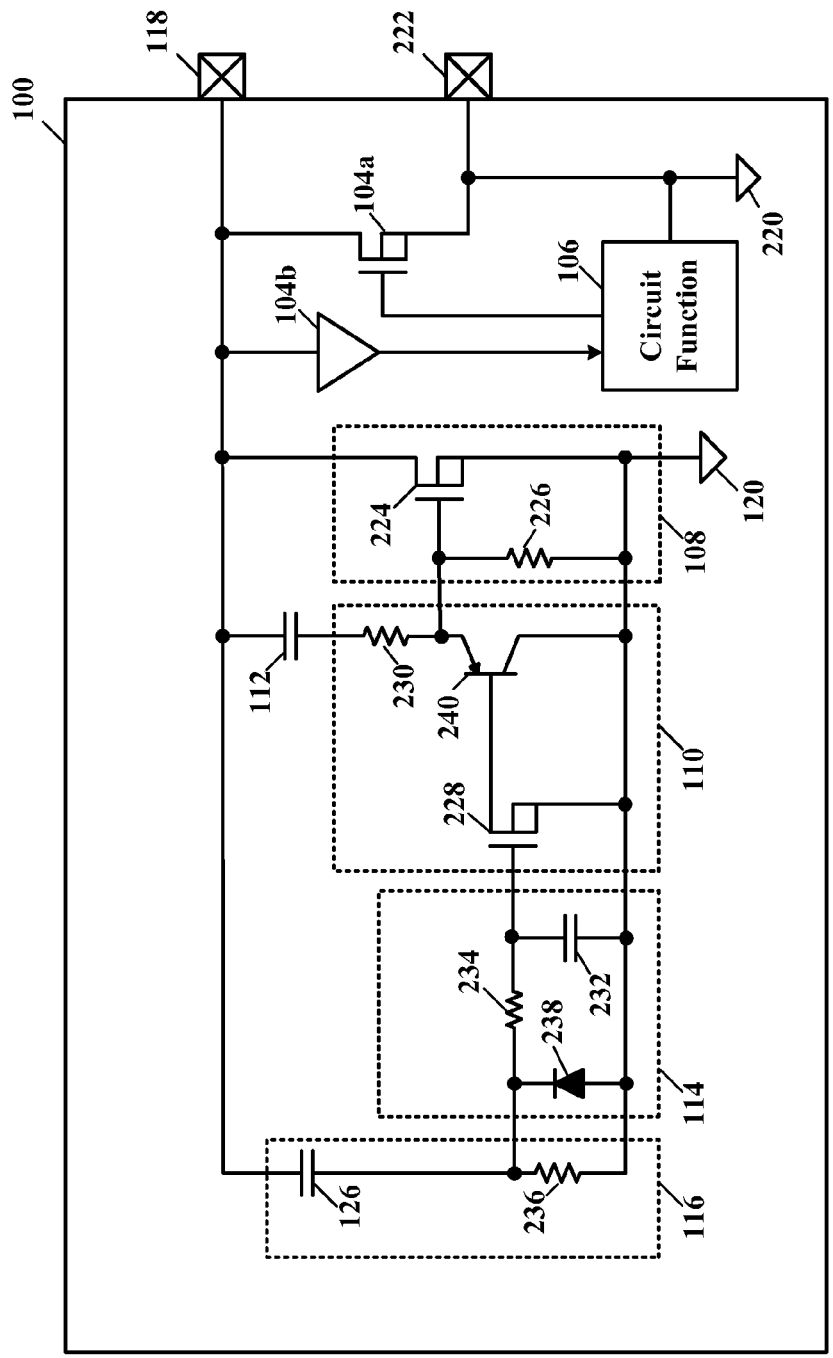
FIG. 2 is a more detailed circuit diagram of a conventional implementation of an ESD and EMI optimization circuit.
Figure 3A:
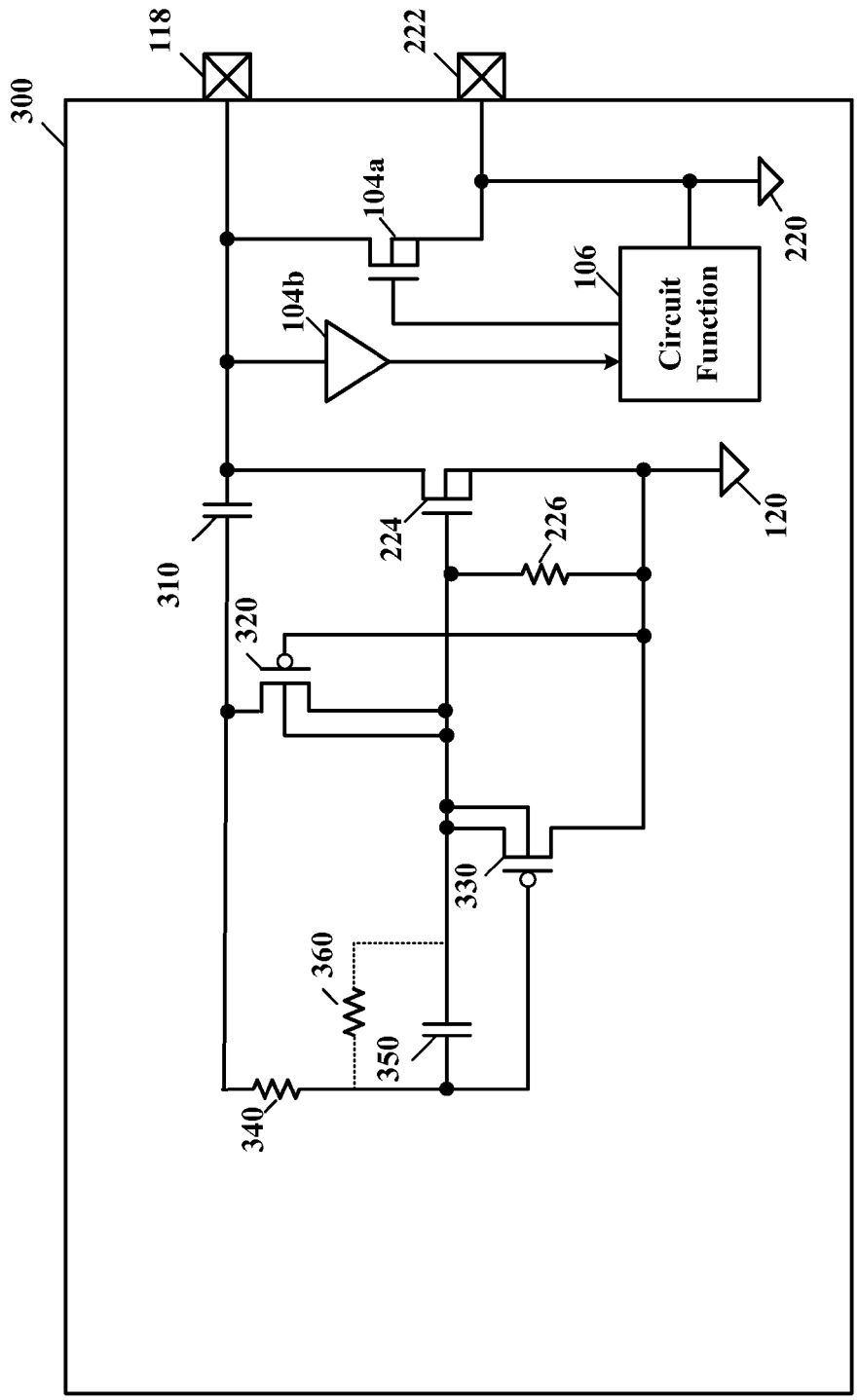
FIG. 3A-C show circuit diagrams of an implementation according to various embodiments.

FIG. 3A shows an exemplary embodiment of an improved protection circuit. As shown in FIGS. 1 and 2, the integrated circuit 300 comprises, for example, a circuit function 106 such as a LIN functionality coupled through a driver 104a which may be an open drain transistor, a tri-state driver, etc. and through a receiver 104b which may be a level detector with external pins 118 and 222. Depending on the functionality, the circuit may comprise only a receiver 104b or only a driver 104a or both. The receiver 104b and/or driver 104a is/are also coupled to the signal ground 220 which is connected to the external ground or common connection 222 that may be located on an integrated circuit package of the integrated circuit device 300. As mentioned above, the integrated circuit device 300 may be used for example but is not limited to LIN module or CAN implementation. As will be appreciated by a person skilled in the art, other bus systems that encounter similar problems may be used.

The protection circuit includes NMOS transistor 224 which is coupled between the external pin 118 and ground 120, wherein resistor 226 is coupled between the gate of NMOS transistor 224 and ground. A single AC path is provided by capacitor 310 coupled with a first terminal to external pin 118. The second terminal of capacitor 310 is coupled with the drain of a first PMOS transistor 320 and resistor 340. The source and bulk of PMOS transistor 320 are coupled with the gate of MOS transistor 224 whereas the gate of PMOS transistor 320 is connected to ground. A second PMOS transistor 330 is provided whose drain is coupled to ground and whose source and bulk are also coupled with the gate of NMOS transistor 224. Resistor 340 forms a Low Pass filter together with capacitor 350 both of which are coupled in series between capacitor 310 and the gate of NMOS transistor 224. The node between resistor 340 and capacitor 350 is coupled with the gate of the second PMOS transistor 330. According to some embodiments, the gate capacitance of PMOS transistor 330 may be large enough for ensuring this Low-Pass function. According to further embodiments, other filter circuits may be used that provide for a similar functionality.

According to the proposed embodiment shown in FIG. 3A, a medium to high threshold voltage (>1.5V) ESD device is not needed nor is a fast PNP device as shown in FIG. 2 with PNP transistor 240. Thus the embodiment shown in FIG. 3A has no process limitation. Moreover it uses the single capacitive path for performing both EMI detection and ESD coupling while the conventional implementation as shown in FIG. 1 requires two separate AC paths.

In practice, there may be no path for discharging the LP filtering cap 350 when EMI disappears. Thus the ESD coupling cap may stay bypassed to ground for a long time inducing a long recovery time to full ESD capability. Such a discharging path can be achieved adding a resistor 360 in parallel with capacitor 350 as indicated by the dotted lines in FIG. 3A. But this resistance needs being large and may require significant area. Hence, according to another embodiment as shown in FIGS. 3B and 3C this can be done as well using diode connected transistor 365 or 370 in parallel with capacitor 350.

Figure 3B:
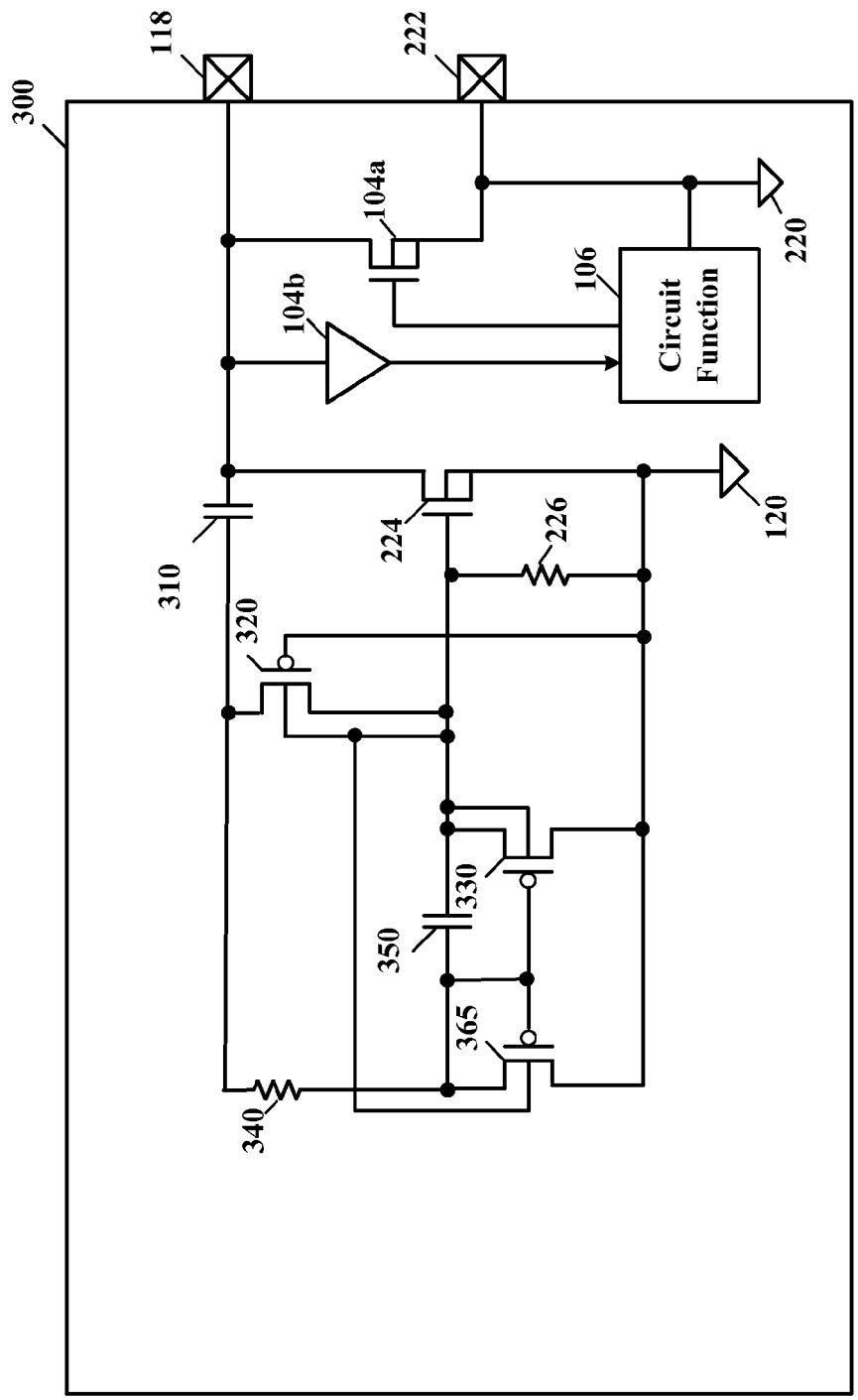

A first possible solution is shown in FIG. 3B where an additional PMOS transistor 365 is provided. The drain of this PMOS transistor 365 is coupled with the node between resistor 340 and capacitor 350. The source of PMOS transistor 365 is connected to ground. The gate of PMOS transistor 365 is connected with its drain and the bulk is connected with the bulk of PMOS transistor 320.

Figure 3C:
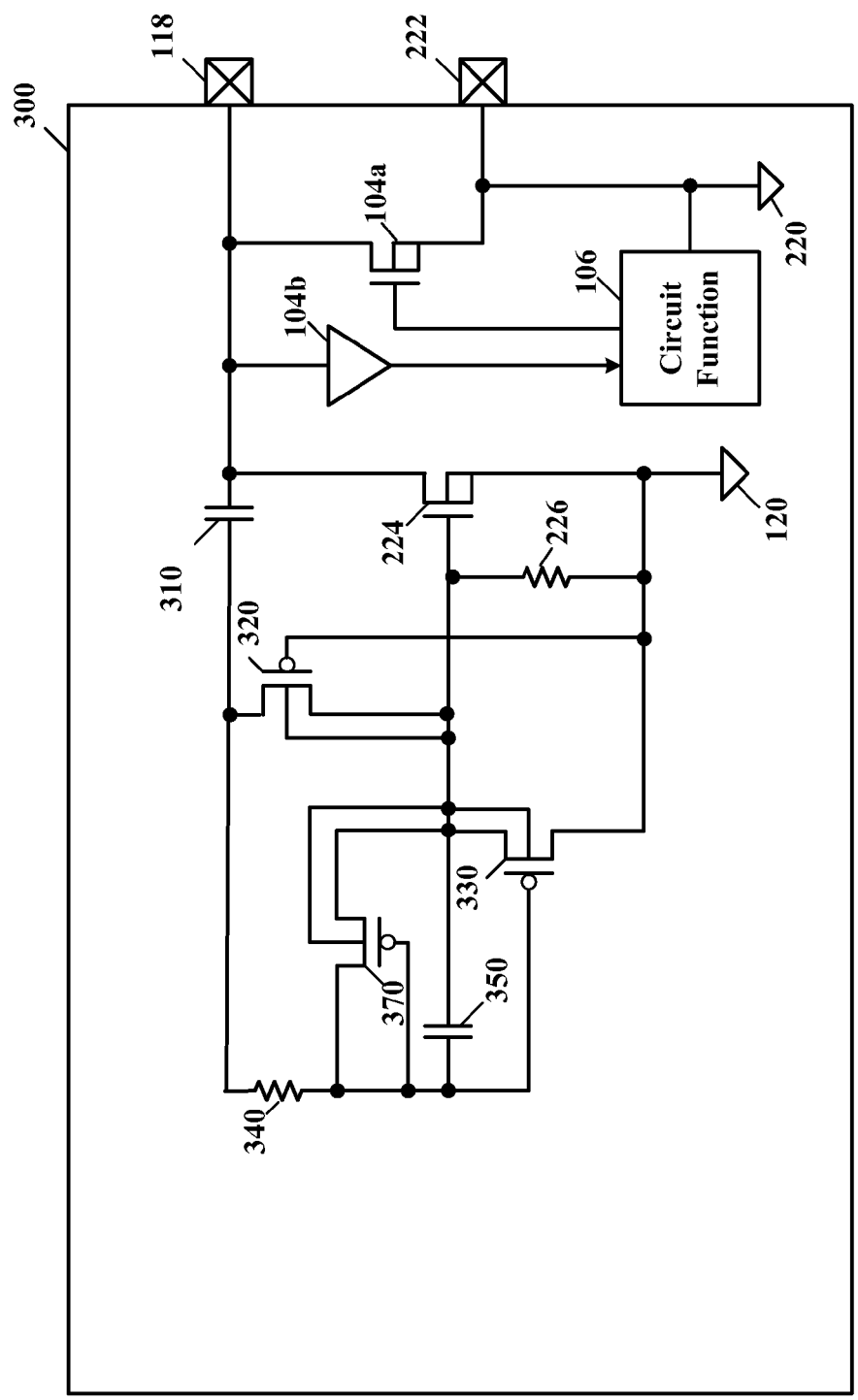

In a second possible solution as shown in FIG. 3C, an additional local clamp and discharge circuit in form of PMOS transistor 370 may be added for improving this new protection principle as shown in FIG. 3A. In this embodiment, source and bulk of PMOS transistor 370 are coupled with the node between capacitor 350 and source and bulk of PMOS transistor 330 whereas gate and drain are coupled with the node between resistor 340 and capacitor 350. Such a discharging path for capacitor 350 as shown in FIGS. 3B and 3C may provide for a fast reset of the EMI clamp when EMI disappears.

The drain-to-gate coupling capacitor 310 is connected to the gate of the ESD device 224 through PMOS switch transistor 320 having its gate connected to the ground (common gate configuration). A positive zap occurring on the drain of the ESD device 224 is transferred to the source of this PMOS switch 320 and pulls up the source. This turns on the switch 320 and couples the ESD capacitor 310 to the gate of the ESD device 224 and thus improves the ESD robustness.

When EMI is applied, the non-linear behavior of the switch 320 induces a rectifying effect that generates a negative DC component on the waveform across capacitor 310 and the switch 320. This negative DC component is extracted through a low-pass filter 340, 350 and applied to the gate of a second PMOS transistor 330 turning it on and thus strongly grounding the gate of the NMOS ESD transistor 224. Thus the EMI waveform reaching the gate of the NMOS ESD device 224 is bypassed to ground. Moreover the remaining voltage on the gate at the NMOS ESD device 224 has a negative component that makes it strongly off.

The delay of the AM low-pass-filter 340, 350 delays the turning "on" of the bypass switch when EMI is applied on the bus. Therefore a short dominant pulse may appear on the bus at the beginning of a EMI perturbation. In order to minimize the duration of this parasitic dominant state on the bus, the low-pass-filter time constant needs to be short. However, this time constant also needs to be large enough for proper low-pass filtering of the low-frequency EMI. A typical time constant of 400 ns may thus be considered as a good trade-off. It is long enough to filter-out 1 MHZ EMI and short enough to generate a transient state on the bus that will be filtered out by the low-pass/deglitch filter of the receiver thus being invisible for the system. The maximum data rate of a LIN bus is 20 KB (min bit duration is 50 us).

The protection circuit as shown in FIG. 3A-C can achieve a high ESD robustness (>6 KV) and a high EMI immunity (>36 dBm) on the external connection pin. As mentioned before, ESD robustness is required during handling of a module containing the integrated circuit or when such a module is plugged or unplugged from a car bus system. When such a module is connected to the car bus system, there is no longer a direct path for an ESD discharge to the integrated circuit device. Therefore the ESD requirements are significantly lower. However a bus line connected to the integrated circuit forms a good antenna for electromagnetic field around the car and a high level HF voltage (EMI) can be superimposed on the bus signal. The circuits shown in FIGS. 3A-C ensure that such high frequency signals superimposed on the bus signal do not affect the accuracy of a transmission on the bus. The protection circuit forms an intelligent drain-to-gate coupling. Thus, a drain-to-gate coupling can be avoided in order to reach high EMI robustness. The protection circuit detects any EMI on the external connection pin. If the EMI is present the drain-to-gate capacitance of the ESD device is disconnected or by-passed to ground, thus it does not inject energy on the gate of the ESD device and prevents the ESD protection corrupting data communication. However, when EMI is absent, the drain-to-gate capacitance is connected, thus ESD robustness is improved.

Figure 4A:
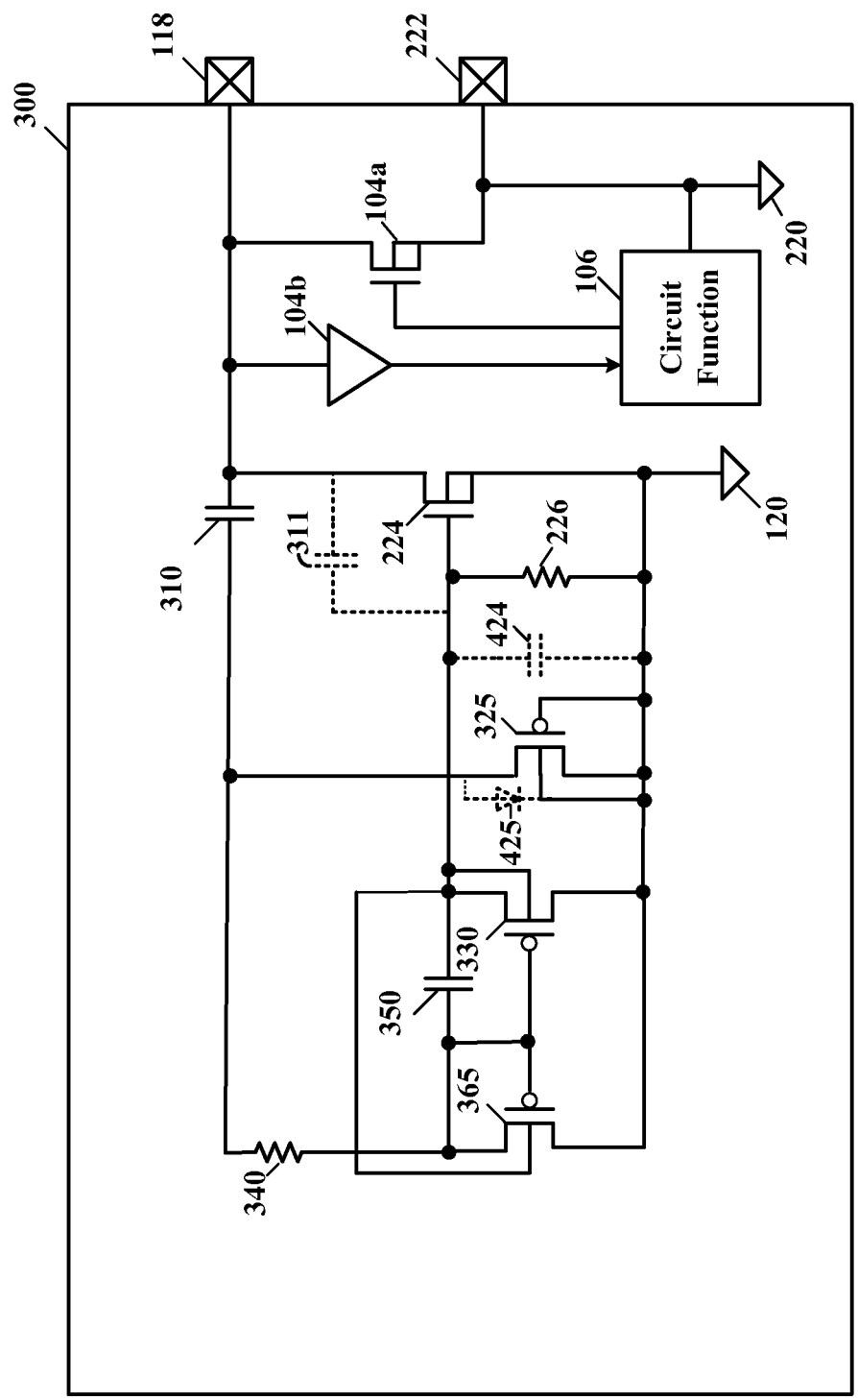
FIG. 4A-C show circuit diagrams of an implementation according to further embodiments.

In some processes, the intrinsic drain to gate capacitance 311 (dashed) of the ESD transistor is large enough to couple the required energy on the gate during an ESD event. Thus there may be no need for additional coupling capacitor. However the intrinsic drain to gate capacitor 311 needs to be grounded when EMI is present on the line in order to prevent corrupting the data communication. Such function can be easily achieved with minor change to the proposed solution in FIGS. 3A-C: As shown in FIG. 4A, which shows a modified circuit of FIG. 3B, the coupling PMOS transistor 320 is replaced by PMOS transistor 325 which is now disconnected from the gate of the ESD transistor 224 and is now grounded in order to operate as a rectifier. The same change can be provided for the circuits as shown in FIGS. 3A and 3C.

In some processes, the intrinsic drain to gate capacitance 311 of the ESD transistor may be too large to couple the optimal energy on the gate during an ESD event. This can be fixed according to another embodiment by increasing the gate capacitance of the ESD transistor 224 through additional gate to source/bulk capacitance 424 which is shown in FIG. 4A with the dashed lines.

When EMI is present, pulsed voltage having a negative component is developed on the drain of transistor 325. This negative component is applied to the gate of the EMI by-pass transistor 330 through the resistor 340 and capacitor 350 low-pass filter turning it on. Finally the gate of ESD transistor 224 is strongly grounded and the circuit is in a similar situation as the previous schematic according to FIGS. 3A-C, namely the ESD transistor 224 is maintained "off".

When an ESD event occurs, no voltage is developed on the gate of the EMI by-pass transistor 330 so it is off. The gate of ESD transistor 224 is thus weakly grounded through resistor 226. Therefore the ESD event is coupled to the gate of ESD transistor 224 through its intrinsic drain to gate capacitance. Here again the circuit is in a similar situation as the previous schematic as shown in FIGS. 3A-C.

Figure 4B:
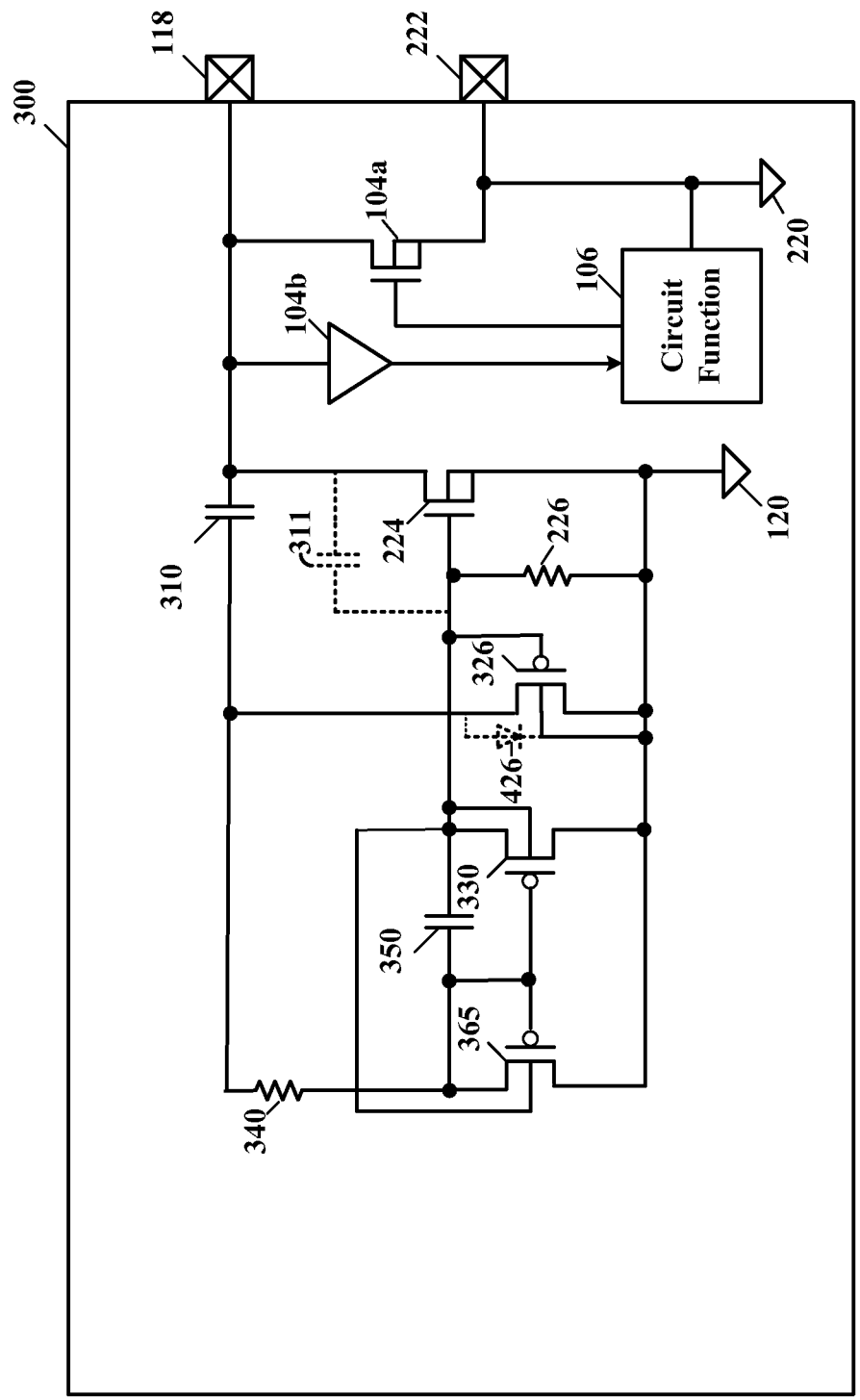

It is to be noted that transistors 325 and 330 need to be formed in separated wells. The well (bulk) of transistor 325 is now grounded while the well (bulk) of transistor 330 is still connected to the gate of the ESD transistor 224. A person skilled in the art will appreciate that in this configuration, the rectifying effect is mainly due to the intrinsic drain to well (bulk) diode 425 of transistor 325. This intrinsic diode 425 is shown with dotted lines in FIG. 4A. In yet another embodiment, as shown in FIG. 4B, the gate of the rectifying transistor 326 may be connected to the gate of the ESD transistor 224. Here again the rectifying effect is mainly due to the intrinsic drain to well (bulk) diode 426 (dashed) of rectifying transistor 326. However, the rectifying effect of this diode may be slightly modified connecting the gate of the rectifying transistor to the gate of the ESD transistor 224 rather than to ground.

Figure 4C:
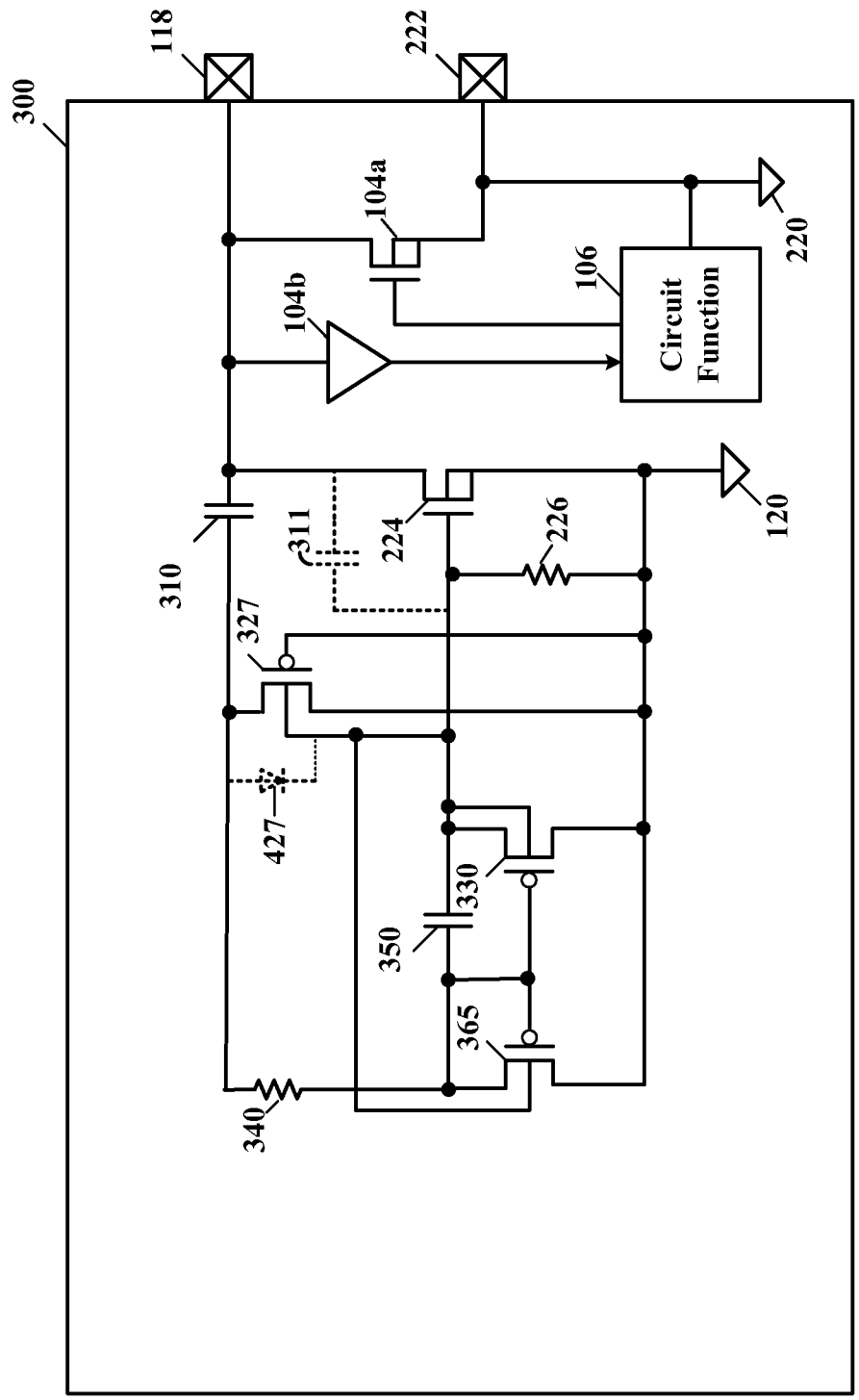

In yet another embodiment, as shown in FIG. 4C, keeping all PMOS transistors in the same well would maintain the coupling between the gate of ESD transistor 224 and the capacitor 310 through the intrinsic diode 427 of transistor 327. Here, transistor 325 from the circuit shown in FIG. 4A is replaced by transistor 327, wherein the drain of transistor 327 is again coupled with capacitor 310 whereas the source and gate are grounded. The parasitic diode 427 is shown with dotted lines. The bulk of transistor 327 is connected with the gate of the ESD transistor 224. Thus, the circuit as shown in FIG. 4C would behave somehow the same way as the circuit of FIGS. 3A-C.

Figure 5:
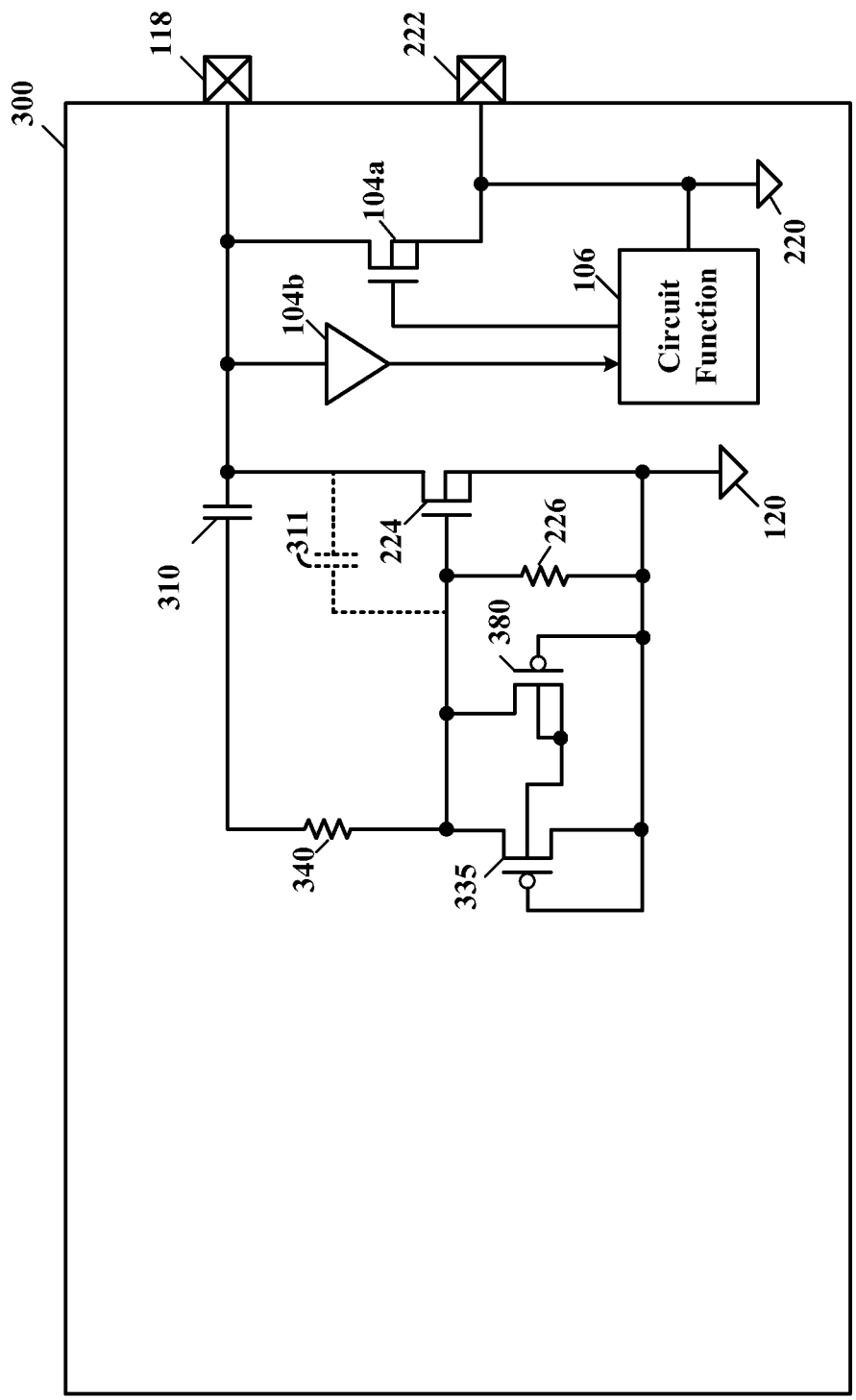
FIG. 5 is a circuit diagram of an implementation according to yet another embodiment.

When the ESD transistor 224 has a larger VT than the grounding device 330 (at least by 500 mV) the simplified solution of FIG. 5 may be used according to yet another embodiment. Here pass transistor 320, LP capacitor 350 and discharging transistor 360/365/370 can be removed, the ESD coupling cap 310 can be directly coupled to the gate of ESD transistor 224 and the gate of transistor 335 which replaces former transistor 330 is grounded. However maintaining resistor 340 helps protecting the gate of the ESD transistor 224. When EMI is applied the non linearity of by-pass device 335 develops a negative voltage on the gate of the ESD transistor 224 maintaining it "off".

When an ESD event occurs, it is coupled to the gate of ESD transistor 224 through capacitor 310. This turns "on" the by-pass device 335. So the by-pass device 335 needs to be sized as a moderate to weak by-pass device in order to allow sufficient energy transferred to the gate of the ESD transistor 224. Transistor 380 needs to be added in order to ensure proper biasing of the bulk of by-pass device 335. The proposed circuit as shown in FIG. 5 may not react as fast as the ones proposed in FIGS. 3A-C and 4A-B, but on the other hand is very simple and requires low area.

Figure 6A:
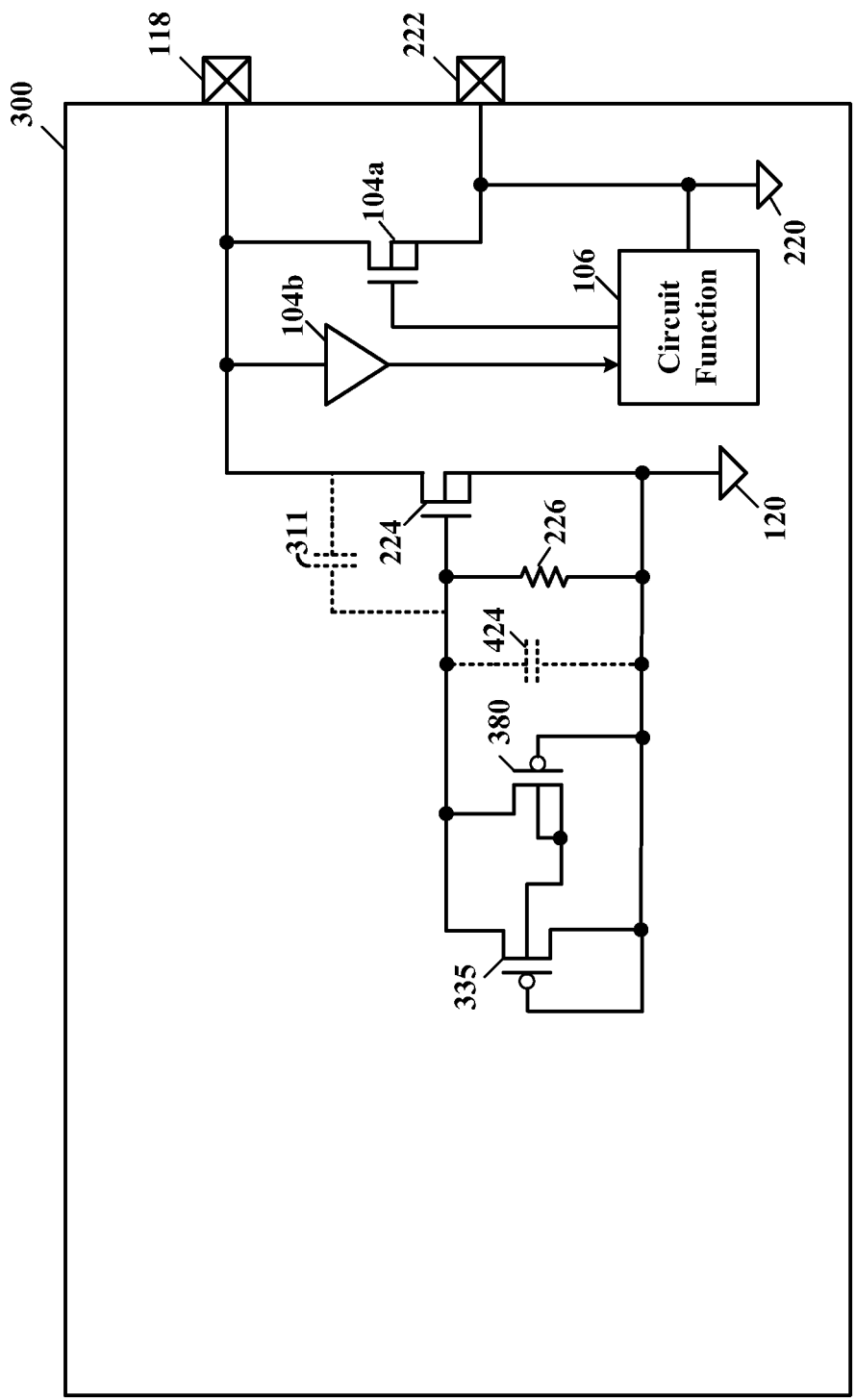
FIG. 6A-F show circuit diagrams of an implementation according to yet further embodiments.

It can be very compact when the intrinsic drain-to-gate capacitance 311 of the ESD transistor 224 is large enough to prevent the need of coupling cap 310. Thus, FIG. 6A shows another embodiment in which the coupling capacitor 310 is replaced by the intrinsic drain-gate capacitance of ESD transistor 224. For both FIGS. 5 and 6A it may be worth maintaining the weak pull-down resistor 226. This ensures that the ESD transistor 224 is perfectly off when no special event occurs on the pin it protects.

Similarly to the embodiment shown in FIG. 4A, an additional gate to ground capacitance 424 can be added when the intrinsic drain to gate capacitance is too large as shown with dotted lines in FIG. 6A.

Figure 6B:
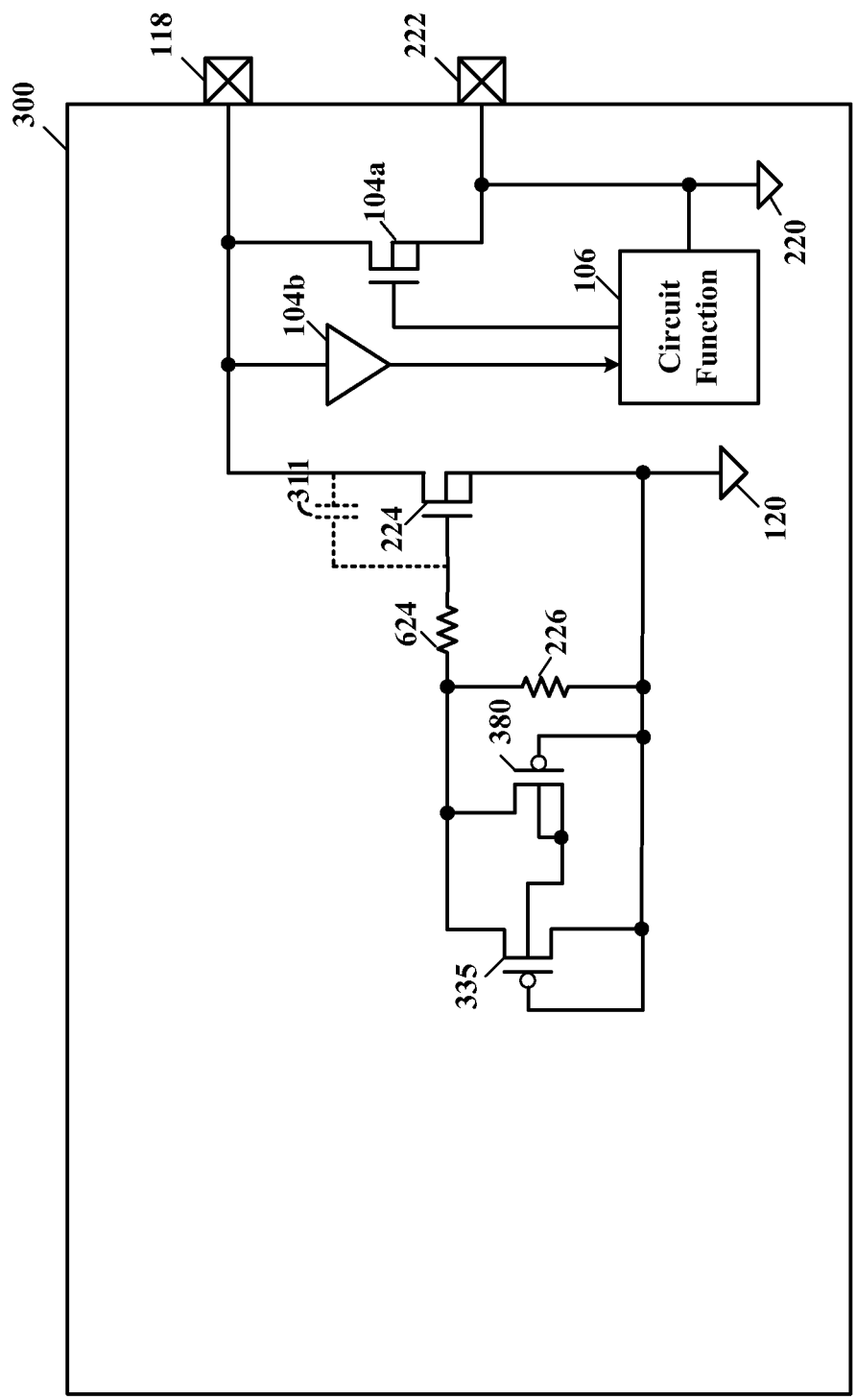

In some applications a HV gate device or field device may be preferred for implementing the ESD device 224. The threshold voltage of device 224 becomes very high which is good for EMI immunity. However the gate grounding device 335 may clamp the gate voltage of device 224 below its threshold voltage during an ESD event. Thus no channel is created in device 224 during the ESD event and the ESD efficiency will be degraded. This can be avoided adding a series resistor 624 between the gate of ESD device 224 and the grounding network 226, 335, and 380 as shown in FIG. 6B.

Figure 6C:
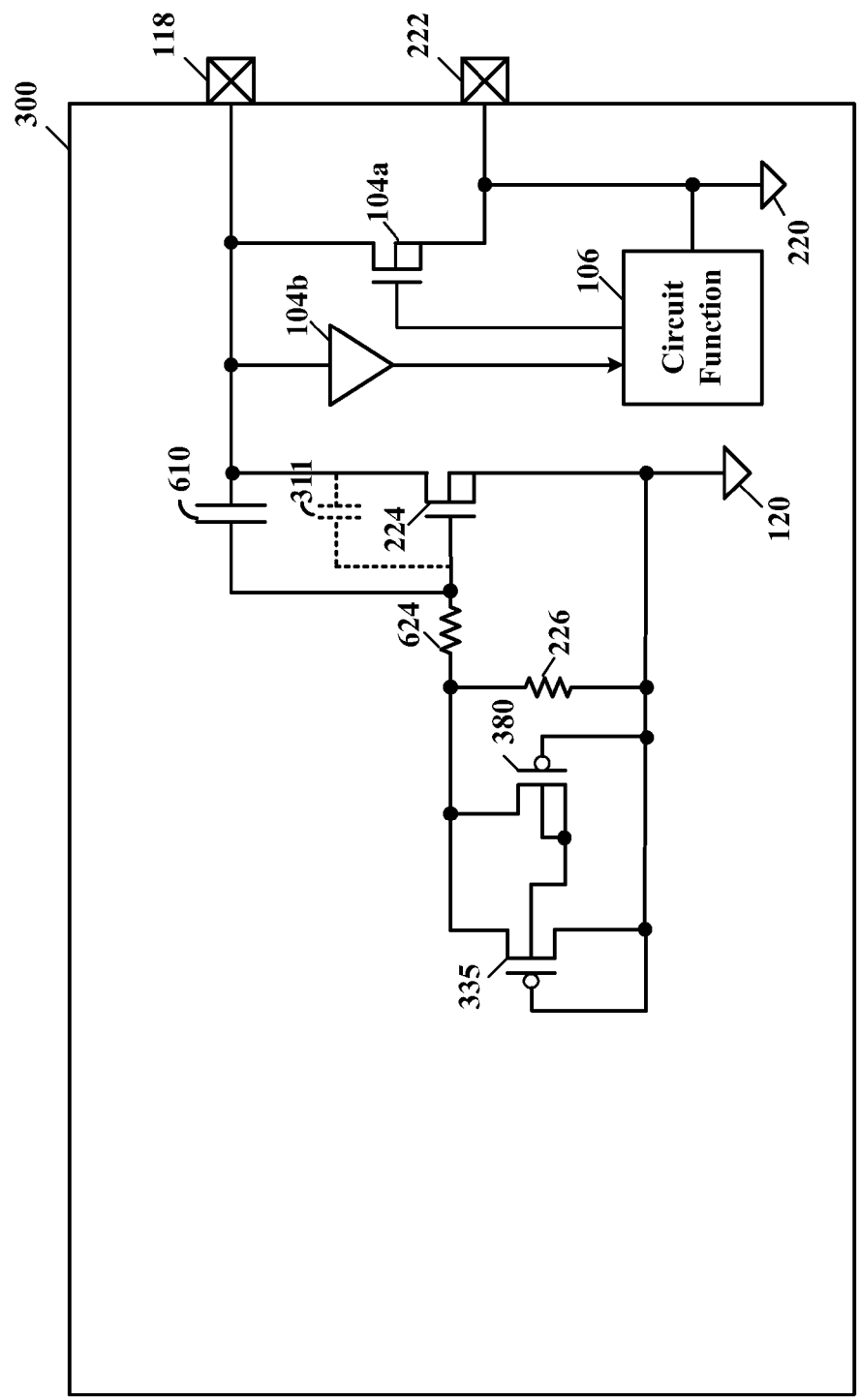

Under this condition, the intrinsic drain to gate capacitance 311 is usually large enough to turn-on the channel during the ESD event so no additional drain to gate coupling capacitor is needed. Additional drain-to-gate coupling capacitor 610 can be added when the intrinsic drain to gate capacitance 311 is too small for transferring the required voltage on ESD device 224 as shown in the embodiment in FIG. 6C.

Figure 6D:
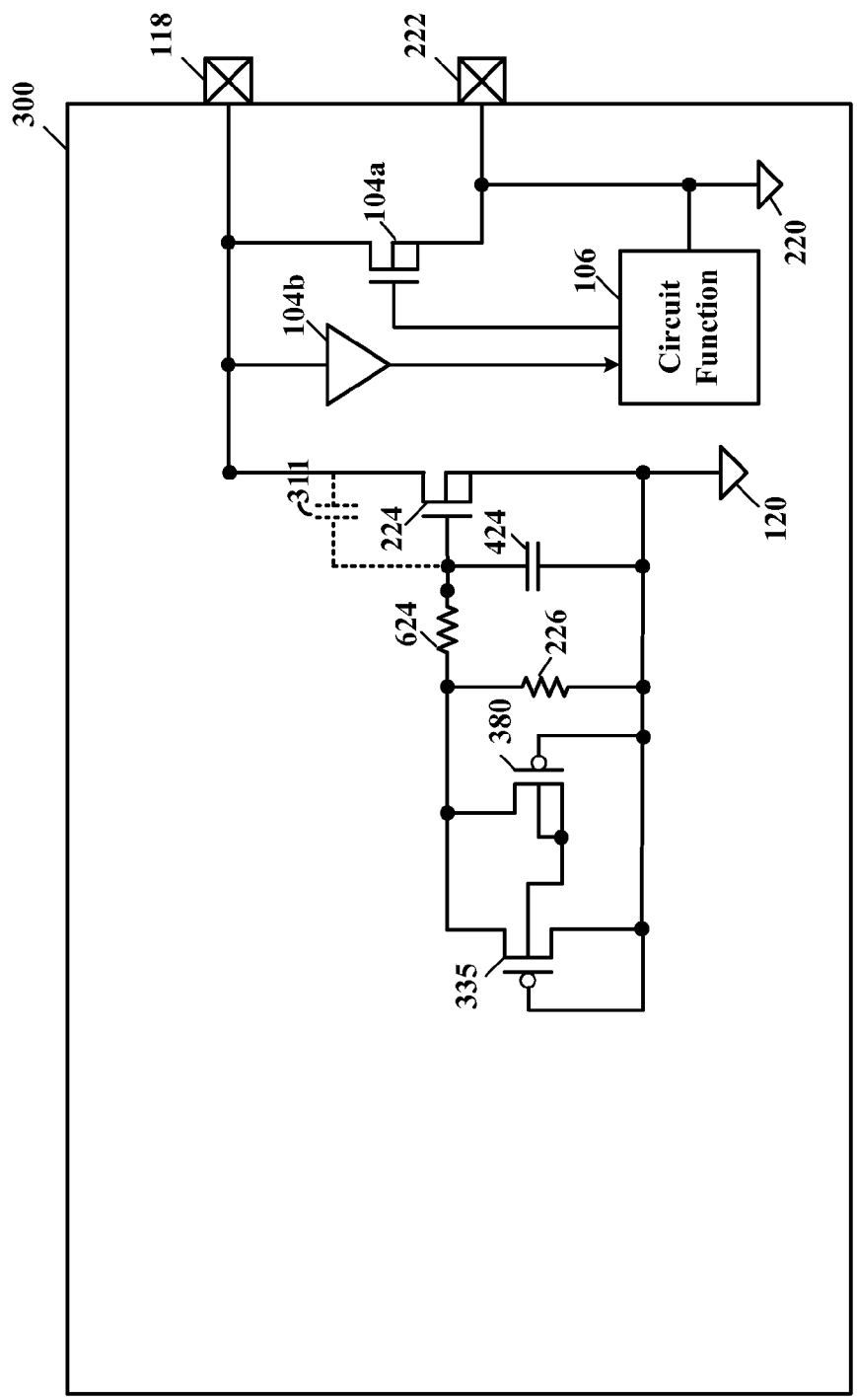

On the opposite situation, when the intrinsic drain to gate capacitance 311 is too large, an additional gate to ground capacitance 424 can be added as shown in FIG. 6D. It is furthermore as well possible to try to limit the gate voltage through the grounding resistors value however this solution may be poor because the clamping effect will depend on the slope of the ESD event and may be too strong during slow ESD events while too weak during fast ESD events. As a reminder, the resistor 226 value should be chosen to provide about 30 ns RC time constant with the gate capacitance of the ESD device 224. Such a time constant is long compared to the rising time of the ESD event and thus have minor impact on the voltage developed on the gate of ESD device 224 during the ESD event.

Figure 6E:
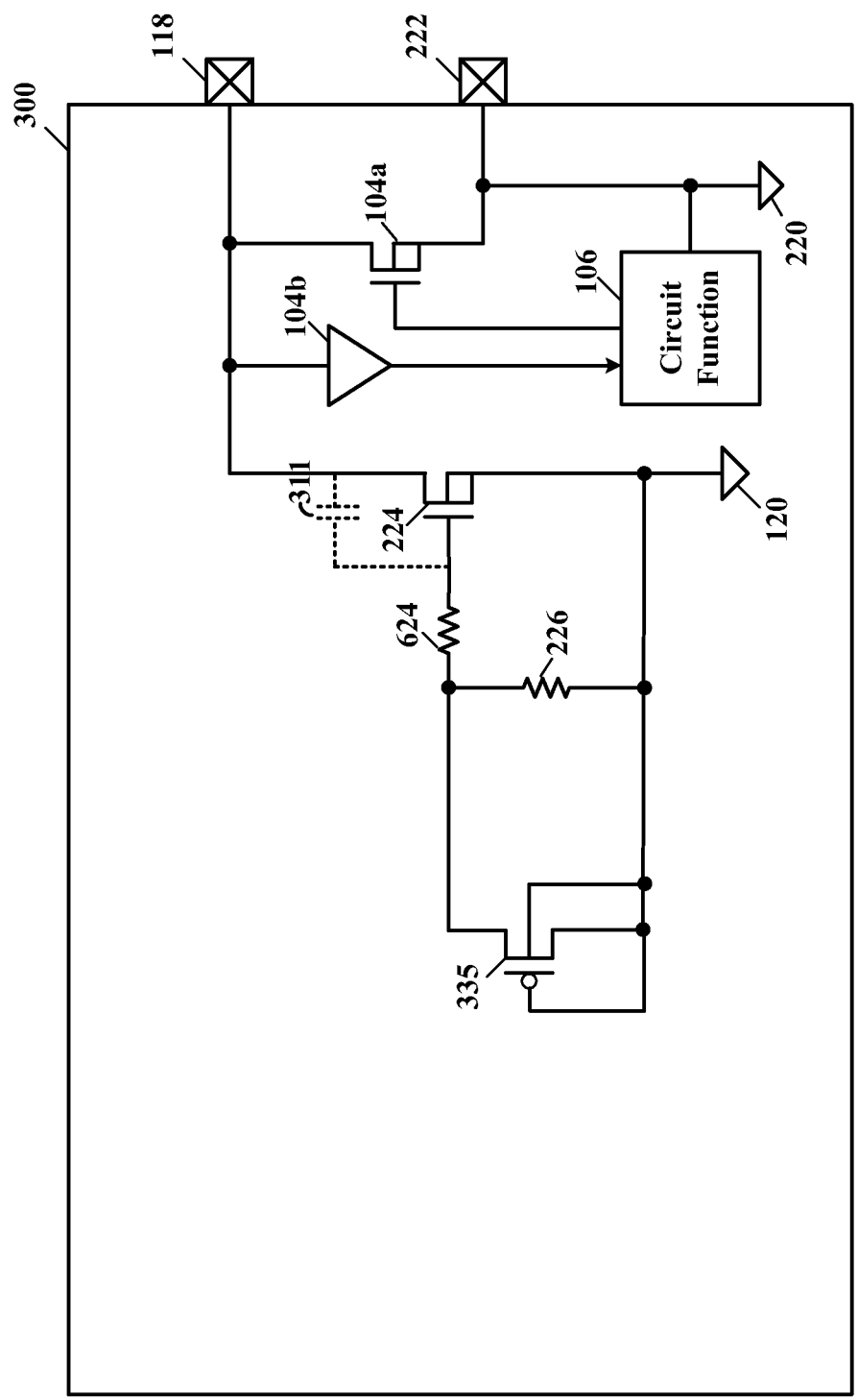

As mentioned above, the triggering voltage on the gate of ESD device may be large and significantly exceed the drain/source allowable voltage of standard LV devices. Therefore, device 335 may need to be configured as a HV device. Many processes require a single source/body node for their HV devices. Consequently, separated access to the bulk of device 335, as shown in FIGS. 6A to 6D is no longer possible, and transistor 380 may be removed as shown in the embodiment in FIG. 6E. The bulk/source node of device 335 is now connected to ground. Skilled designer will notice that the drain to bulk intrinsic diode of device 335 will have a significant impact on the rectifying effect of device 335.

Figure 6F:
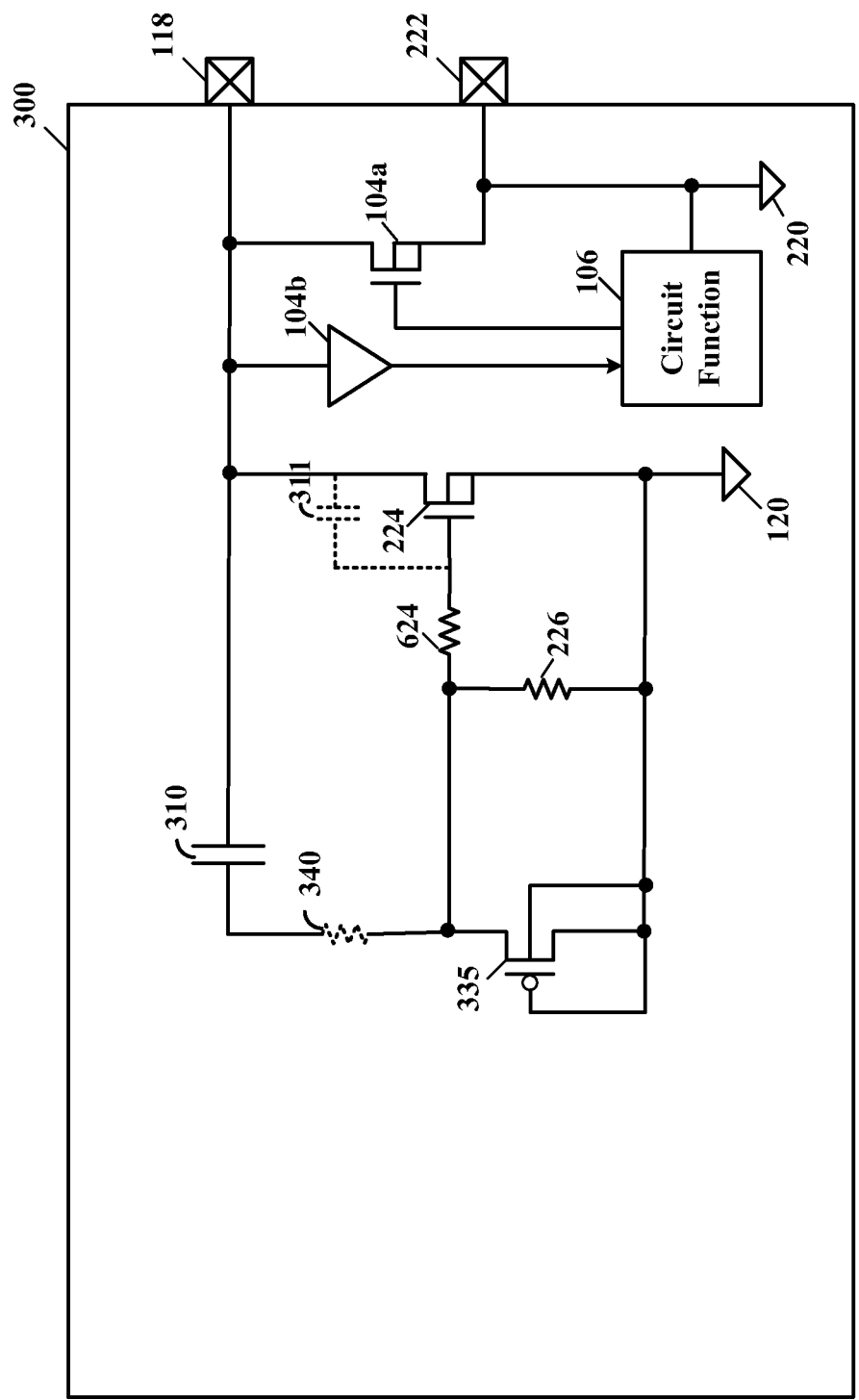

Adding a coupling cap 310 or a resistor-capacitor combination 340, 310 between the drains of ESD transistors 224 and rectifying transistor 335 as shown in FIG. 6F will improve the EMI robustness. Resistor 340 may be optional as indicated with the dotted lines. This modification is also valid for FIGS. 6A to 6E according to various other embodiments.

Figure 7:
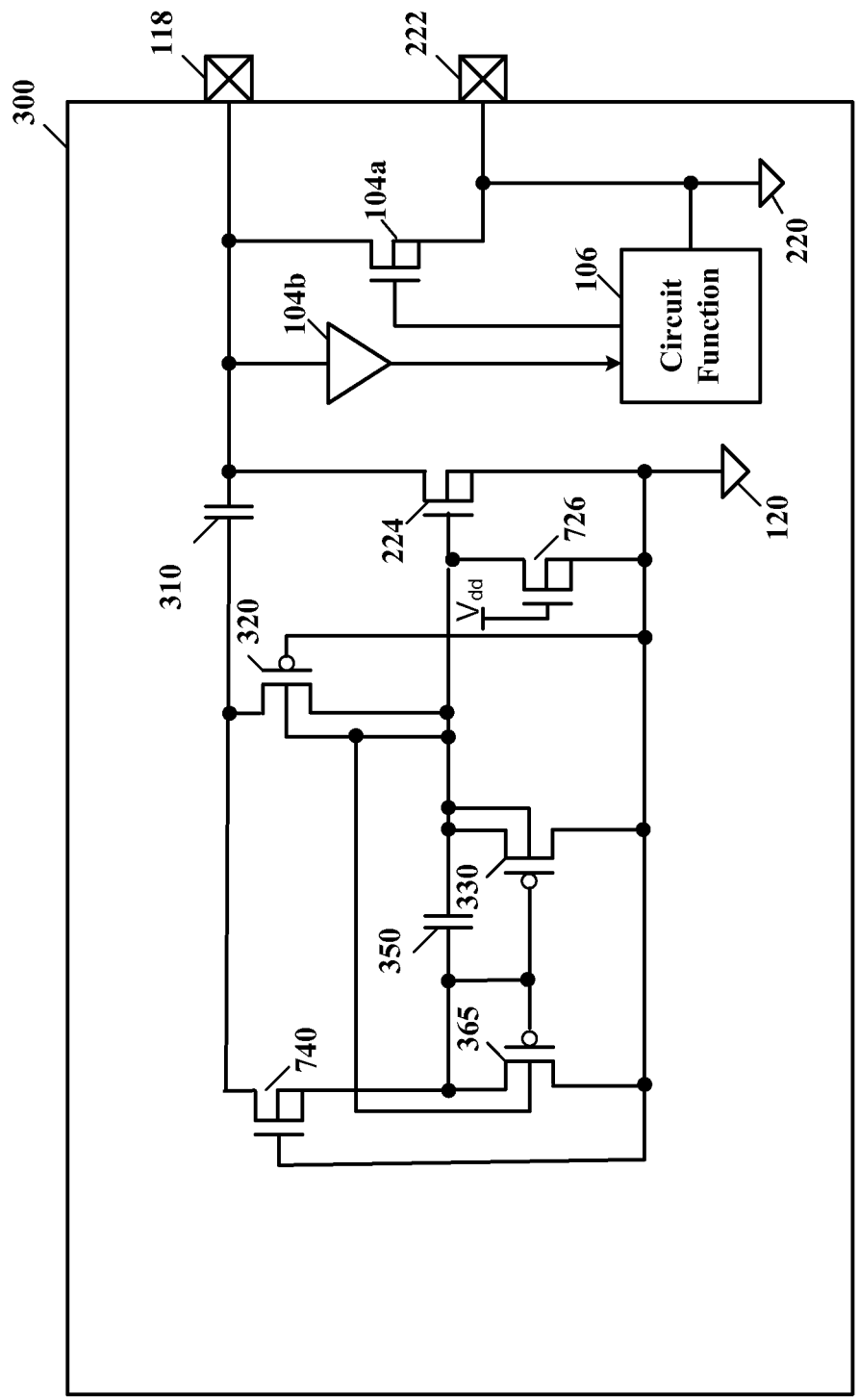
FIGS. 7 and 8 show alternative embodiments substituting resistors 340 and 326 with transistor structures.
Figure 8:
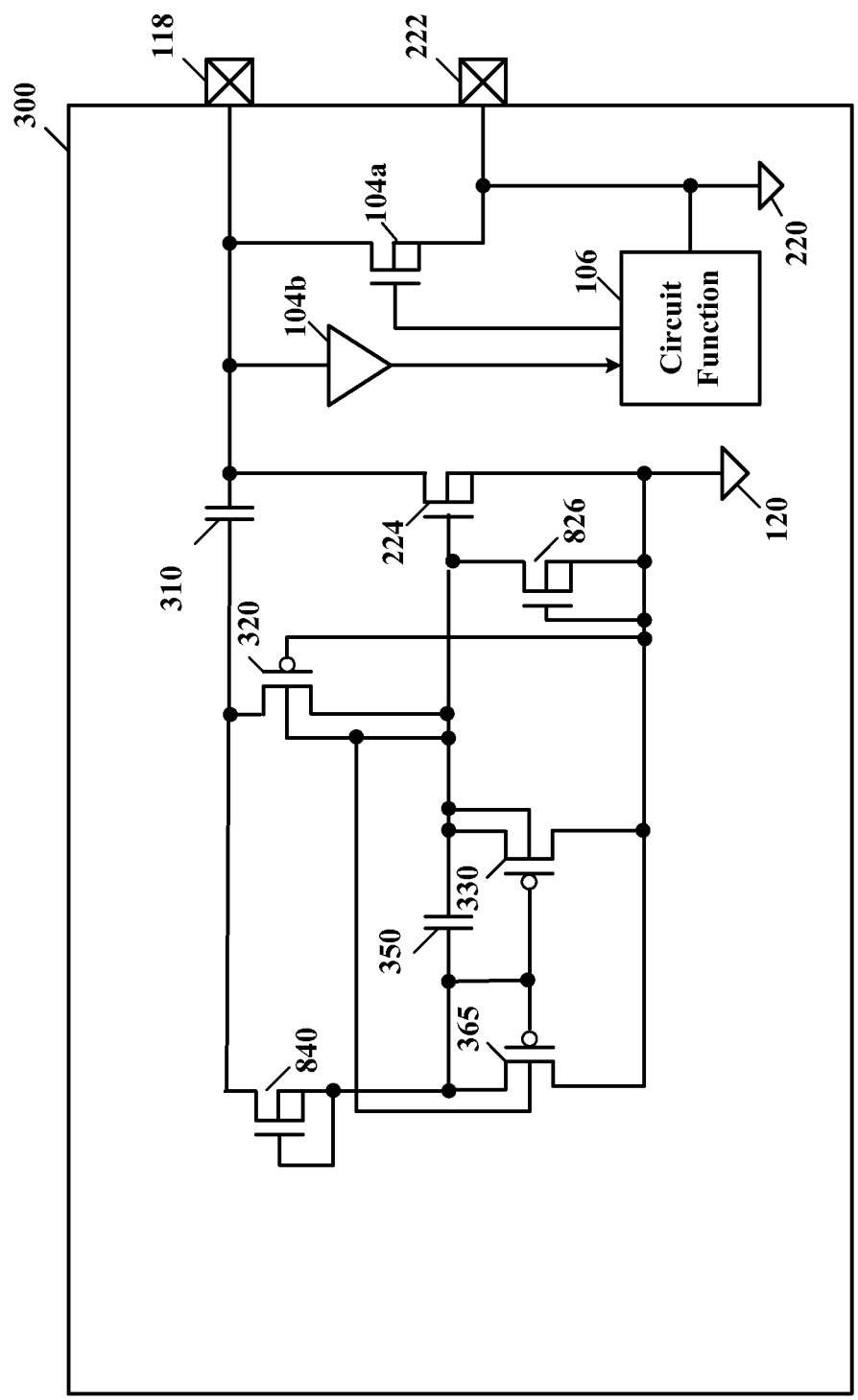

In some applications the user may prefer using MOS or JFET transistor instead of resistors. One possible solution is shown in FIG. 7 where resistors 226 and 340 are replaced by NMOS transistors 726 and 740. Here the transistor 726 is turned "on" as soon as the Vdd supply voltage is present, while transistor 740 transfers negative alternates present at the 2 nd terminal of capacitor 310 to the gate of transistor 330. These transistors could be as well depletion or JFET devices as shown in FIG. 8. The use of depletion or JFET devices 826 and 840, when available, is preferable since they are already "on" with a zero gate voltage. Thus the gate of device 224 will always be grounded, not only when $V_{dd}$ is present. The solutions proposed in FIGS. 7 and 8 are not exhaustive and mixed solutions (e.g. replacing only one resistor) are possible as well. Hence, other equivalent substitutions for the resistors are contemplated.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device having an adaptive electrostatic discharge (ESD) protection, comprising:
    an external connection pin to be protected from ESD;
    an external ground connection pin;
    an adaptive electrostatic discharge (ESD) protection circuit comprising:
        an ESD protection N-metal oxide semiconductor (NMOS) transistor having drain connected to the external connection pin and a source and bulk connected to ground;
        a resistor coupled between a gate of the NMOS transistor and ground;
        a first PMOS transistor having a source coupled to a gate of the NMOS transistor and a drain connected to ground;
        a first capacitor having a first terminal connected to the external connection pin and a second terminal that is coupled with the gate of the NMOS transistor, wherein the first capacitor within the adaptive ESD protection circuit is the only capacitor connected to the external connection pin.

2. The integrated circuit device according to claim 1, comprising
    a second P-metal oxide semiconductor (PMOS) transistor having a drain connected to the second terminal of the first capacitor, a source and bulk connected to the gate of the NMOS transistor and a gate connected to ground, wherein a source and bulk of the first PMOS transistor is connected to the gate of the NMOS transistor and a drain of the first PMOS transistor is connected to ground; and
    a filter coupled between the second terminal of the first capacitor and the gate of the first PMOS transistor.

3. The integrated circuit according to claim 2, wherein the filter comprises a second resistor connected between the second terminal of the first capacitor and a gate of the first PMOS transistor and a second capacitor connected between the source and the gate of the first PMOS transistor.

4. The integrated circuit according to claim 3, wherein the time constant of the filter is about 400 ns.

5. The integrated circuit device of claim 3, further comprising a third resistor coupled in parallel with said second capacitor.

6. The integrated circuit device of claim 3, further comprising a third PMOS transistor having a drain and gate connected to the gate of the second PMOS transistor, a bulk connected to the bulk of the first PMOS transistor, and a source connected to ground.

7. The integrated circuit device of claim 3, further comprising a third PMOS transistor having a drain and gate connected to the gate of the second PMOS transistor, a bulk and source connected to the bulk and source of the second PMOS transistor.

8. The integrated circuit device according to claim 3, wherein the second resistor is formed by a transistor.

9. The integrated circuit according to claim 2, wherein the time constant of the filter is about 400 ns.

10. The integrated circuit according to claim 1, further comprising
    a data bus interface coupled to the external connection;
    a circuit function coupled to the data bus interface.

11. The integrated circuit device of claim 1, wherein a data bus interface is at least one of a data bus receiver and a data bus driver.

12. The integrated circuit device of claim 1, wherein a circuit function is a digital logic function.

13. The integrated circuit device of claim 1, wherein a circuit function is an analog circuit function or a mixed signal circuit function.

14. The integrated circuit device of claim 1, wherein a data bus to be connected to the external connection is a Local Interconnect Network (LIN) bus or a Controller Area Network (CAN) bus.

15. The integrated circuit device according to claim 1, comprising
    a second P-metal oxide semiconductor (PMOS) transistor having a drain connected to the second terminal of the first capacitor, a source and bulk connected to ground, wherein the source and a bulk of the first PMOS transistor are connected to the gate of the NMOS transistor and a drain of the first PMOS transistor is connected to ground; and
    a filter coupled between the second terminal of the first capacitor and the first PMOS transistor.

16. The integrated circuit device according to claim 15, wherein the gate of the second PMOS transistor is coupled with ground.

17. The integrated circuit device according to claim 16, further comprising a second capacitor coupled between the gate of the NMOS transistor and ground.

18. The integrated circuit device according to claim 15, wherein the gate of the second PMOS transistor is coupled with the gate of the NMOS transistor.

19. The circuit arrangement according to claim 15, wherein the filter comprises a second resistor connected between the second terminal of the first capacitor and a gate of the first PMOS transistor and a second capacitor connected between the source and the gate of the first PMOS transistor.

20. The integrated circuit device of claim 19, further comprising a third resistor coupled in parallel with said second capacitor.

21. The integrated circuit device of claim 19, further comprising a third PMOS transistor having a drain and gate connected to the gate of the first PMOS transistor, a bulk connected to the bulk of the second PMOS transistor, and a source connected to ground.

22. The integrated circuit device of claim 19, further comprising a third PMOS transistor having a drain and gate connected to the gate of the first PMOS transistor, a bulk and source connected to the bulk and source of the first PMOS transistor.

23. The integrated circuit device according to claim 19, wherein the second resistor is formed by a transistor.

24. The circuit arrangement according to claim 15, wherein the time constant of the filter is about 400 ns.

25. The integrated circuit device according to claim 1, comprising
   a second P-metal oxide semiconductor (PMOS) transistor having a drain connected to the second terminal of the first capacitor, a bulk connected to the gate of the NMOS transistor, and a source and gate connected to ground, wherein the source and a bulk of the first PMOS transistor are connected to the gate of the NMOS transistor and the drain of the first PMOS transistor is connected to ground;
   a second resistor connected between the second terminal of the first capacitor and a gate of the first PMOS transistor and a second capacitor connected between the source and the gate of the first PMOS transistor, and
   a third PMOS transistor having a source and gate connected to the gate of the first PMOS transistor, a drain connected to the ground and a bulk connected to the bulk of the second PMOS transistor.

26. The integrated circuit device according to claim 1, comprising
   a second P-metal oxide semiconductor (PMOS) transistor having a drain coupled to the second terminal of the first capacitor, a bulk and source connected to a bulk of the first PMOS transistor, and a gate connected to ground, wherein a gate of the first PMOS transistor is connected to ground.

27. The integrated circuit device according to claim 26, further comprising a second resistor connected between the gate of the NMOS transistor and the drain of the second PMOS transistor.

28. The integrated circuit device according to claim 26, wherein a gate-drain capacitance of the NMOS transistor forms the first capacitor.

29. The integrated circuit device according to claim 28, further comprising a second capacitor connected between the gate of the NMOS transistor and ground.

30. The integrated circuit device according to claim 28, further comprising a second resistor connected between the gate of the NMOS transistor and the first resistor.

31. The integrated circuit device according to claim 1, wherein the resistor is formed by a transistor.

32. The integrated circuit device according to claim 1, wherein a gate-drain capacitance of the NMOS transistor forms the first capacitor.

33. The integrated circuit device according to claim 32, wherein a bulk and a gate of the first PMOS transistor are connected to ground.

34. The integrated circuit device according to claim 33, wherein the source of the first PMOS transistor is connected with the gate of the NMOS transistor through a second resistor.

35. The integrated circuit device according to claim 1, wherein a bulk and a gate of the first PMOS transistor are connected to ground.

36. The integrated circuit device according to claim 35, wherein the source of the first PMOS transistor is connected with the gate of the NMOS transistor through a second resistor.

37. The integrated circuit device according to claim 36, further comprising a third resistor connected between the second terminal of the first capacitor and the source of the first PMOS transistor.

38. A motor vehicle comprising
   a data bus selected from the group consisting of a Local Interconnect Network (LIN) bus and a Controller Area Network (CAN) bus;
   an integrated circuit device having an adaptive electrostatic discharge (ESD) protection, the integrated circuit device comprising:
   a data bus interface coupled via an external connection pin with said data bus;
   a circuit function coupled to the data bus interface;
   an external ground connection pin;
   an ESD protection N-metal oxide semiconductor (NMOS) transistor having drain connected to the external connection pin and a source and bulk connected to ground;
   a resistor coupled between a gate of the NMOS transistor and ground;
   a first capacitor having a first terminal connected to the external connection pin;
   a first P-metal oxide semiconductor (PMOS) transistor having a drain connected to the second terminal, a source and bulk connected to the gate of the NMOS transistor and a gate connected to ground;
   a second PMOS transistor having a source and bulk connected to the gate of the NMOS transistor and a drain connected to ground; and
   a filter comprising a second resistor connected between the second terminal of the first capacitor and a gate of the second PMOS transistor and a second capacitor connected between the source and the gate of the second PMOS transistor.

* * * * *